(12) United States Patent
Zhou et al.

(10) Patent No.: US 12,652,804 B2
(45) Date of Patent: Jun. 9, 2026

(54) FABRICATION METHOD FOR A THREE-DIMENSIONAL MEMORY ARRAY OF THIN-FILM FERROELECTRIC TRANSISTORS FORMED WITH AN OXIDE SEMICONDUCTOR CHANNEL

(71) Applicant: SUNRISE MEMORY CORPORATION, San Jose, CA (US)

(72) Inventors: Jie Zhou, San Jose, CA (US); Usha Raghuram, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 465 days.

(21) Appl. No.: 18/468,686

(22) Filed: Sep. 16, 2023

(65) Prior Publication Data
US 2024/0114689 A1    Apr. 4, 2024

Related U.S. Application Data

(60) Provisional application No. 63/377,909, filed on Sep. 30, 2022.

(51) Int. Cl.
*H10B 51/10*    (2023.01)
*H10B 51/20*    (2023.01)
(Continued)

(52) U.S. Cl.
CPC ............. *H10B 51/20* (2023.02); *H10B 51/10* (2023.02); *H10D 30/0415* (2025.01);
(Continued)

(58) Field of Classification Search
None
See application file for complete search history.

(56) References Cited

U.S. PATENT DOCUMENTS 9,281,044 B2    3/2016  Ramaswamy et al.
10,121,553 B2    11/2018  Harari
(Continued)

FOREIGN PATENT DOCUMENTS

CN    111799263 A    10/2020

OTHER PUBLICATIONS

T. S. Böscke, J. Müller, D. Bräuhaus, U. Schröder and U. Böttger, "Ferroelectricity in hafnium oxide: CMOS compatible ferroelectric field effect transistors," 2011 International Electron Devices Meeting, Washington, DC, USA, 2011, pp. 24.5.1-24.5.4, doi: 10.1109/ IEDM.2011.6131606.

*Primary Examiner* — Kretelia Graham
*Assistant Examiner* — William Henry Anderson

(57)    ABSTRACT

A fabrication process for a memory structure including three-dimensional arrays of thin-film ferroelectric storage transistors is disclosed. In some embodiments, the ferroelectric storage transistors are organized in three-dimensional arrays of horizontal NOR memory strings. In some embodiments, the fabrication process uses a liner underlayer in the deposition process of the channel layer where the liner underlayer provides a uniform surface for the deposition of the channel layer and also serves as an etch stop layer in the subsequent metal replacement process. In another embodiment, the fabrication process applies a liner layer in vertical shafts during the local word line process to reduce or eliminate irregular features in the local word line structures, thereby enhancing the electrical characteristics and reliability of the memory arrays thus formed.

24 Claims, 22 Drawing Sheets

(51) Int. Cl.

| | | |
|---|---|---|
| *H10D 30/01* | (2025.01) | |
| *H10D 30/69* | (2025.01) | |
| *H10D 64/01* | (2025.01) | |
| *H10D 64/68* | (2025.01) | |

(52) U.S. Cl.
CPC ......... *H10D 30/701* (2025.01); *H10D 64/033* (2025.01); *H10D 64/689* (2025.01)

(56) References Cited

U.S. PATENT DOCUMENTS

| | | | |
|---|---|---|---|
| 2020/0176468 A1* | 6/2020 | Herner | ............... H10D 30/0413 |
| 2020/0357822 A1 | 11/2020 | Chen | |
| 2021/0020659 A1 | 1/2021 | Chen | |
| 2021/0407845 A1 | 12/2021 | Wang et al. | |
| 2022/0336498 A1* | 10/2022 | Lai | ........................ H10D 30/701 |
| 2022/0384459 A1* | 12/2022 | Lu | ........................... H10D 99/00 |
| 2023/0027837 A1 | 1/2023 | Petti et al. | |
| 2023/0262987 A1* | 8/2023 | Harari | ................ G11C 16/0483 |
| | | | 257/295 |
| 2023/0262988 A1 | 8/2023 | Harari | |
| 2023/0282283 A1* | 9/2023 | Harari | ................ H10D 30/6755 |
| | | | 257/295 |

* cited by examiner

FABRICATION METHOD FOR A THREE-DIMENSIONAL MEMORY ARRAY OF THIN-FILM FERROELECTRIC TRANSISTORS FORMED WITH AN OXIDE SEMICONDUCTOR CHANNEL

CROSS REFERENCE TO RELATED APPLICATIONS

This application claims priority to U.S. Provisional Patent Application No. 63/377,909, entitled FABRICATION METHOD FOR A THREE-DIMENSIONAL MEMORY ARRAY OF THIN-FILM FERROELECTRIC TRANSISTORS FORMED WITH AN OXIDE SEMICONDUCTOR CHANNEL, filed Sep. 30, 2022, which is incorporated herein by reference for all purposes.

The present application relates to U.S. patent application Ser. No. 17/936,315, entitled MEMORY STRUCTURE OF THREE-DIMENSIONAL NOR MEMORY STRINGS OF JUNCTIONLESS FERROELECTRIC MEMORY TRANSISTORS INCORPORATING AIR GAP ISOLATION STRUCTURES, filed Sep. 28, 2022 ("Patent Application I"), and to U.S. patent application Ser. No. 17/936,320, entitled MEMORY STRUCTURE INCLUDING THREE-DIMENSIONAL NOR MEMORY STRINGS OF JUNCTIONLESS FERROELECTRIC MEMORY TRANSISTORS AND METHOD OF FABRICATION ("Patent Application II"), filed Sep. 28, 2022, which applications are incorporated herein by reference in their entireties.

FIELD OF THE INVENTION

The present invention relates to high-density memory structures and fabrication methods thereof. In particular, the present invention relates to fabrication process for three-dimensional memory array of ferroelectric storage transistors with an oxide semiconductor channel.

BACKGROUND OF THE INVENTION

A NOR-type memory string includes storage transistors that share a common source region and a common drain region, where each storage transistor can be individually addressed and accessed. U.S. Pat. No. 10,121,553 (the '553 Patent), entitled "Capacitive-Coupled Non-Volatile Thin-film Transistor NOR Strings in Three-Dimensional Arrays," issued on Nov. 6, 2018, discloses storage transistors (or memory transistors) organized as 3-dimensional arrays of NOR memory strings formed above a planar surface of a semiconductor substrate. The '553 Patent is hereby incorporated by reference in its entirety for all purposes. In the '553 Patent, a NOR memory string includes numerous thin-film storage transistors that share a common bit line and a common source line. In particular, the '553 Patent discloses a NOR memory string that includes (i) a common source region and a common drain region both running lengthwise along a horizontal direction and (ii) gate electrodes for the storage transistors each running along a vertical direction. In the present description, the term "vertical" refers to the direction normal to the surface of a semiconductor substrate, and the term "horizontal" refers to any direction that is parallel to the surface of that semiconductor substrate. In a 3-dimensional array, the NOR memory strings are provided on multiple planes (e.g., 8 or 16 planes) above the semiconductor substrate, with the NOR memory strings on each plane arranged in rows. For a charge-trap type storage transistor, data is stored in each storage transistor using a charge storage film as the gate dielectric material. For example, the charge storage film may include a tunneling dielectric layer, a charge trapping layer and a blocking layer, which can be implemented as a multilayer including silicon dioxide or oxynitride, silicon-rich nitride, and silicon dioxide, arranged in this order and referred to as an ONO layer. An applied electrical field across the charge storage film adds or removes charge from charge traps in the charge trapping layer, thus altering the threshold voltage of the storage transistor to encode a given logical state in the storage transistor.

Advances in electrically polarizable materials ("ferroelectric materials"), especially those that are being used in semiconductor manufacturing processes, suggest new potential applications in ferroelectric memory circuits. For example, the article "Ferroelectricity in Hafnium Oxide: CMOS compatible Ferroelectric Field Effect Transistors," by T. S. Böscke et al., published in 2011 *International Electron Devices Meeting (IEDM)*, pp. 24.5.1-24.5.4, discloses a ferroelectric field effect transistor ("FeFET") that uses hafnium oxide as a gate dielectric material. By controlling the polarization direction in a ferroelectric gate dielectric layer, the FeFET may be programmed to have either one of two threshold voltages. Each threshold voltage of the FeFET constitutes a state, for example, a "programmed" state or an "erased" state, that represents a designated logical value. Such an FeFET has application in high-density memory circuits. For example, U.S. Pat. No. 9,281,044, entitled "Apparatuses having a ferroelectric field-effect transistor memory array and related method," by D. V. Nirmal Ramaswamy et al., filed on May 17, 2013, discloses a 3-dimensional array of FeFETs.

SUMMARY OF THE INVENTION

The present disclosure discloses a process for fabrication a memory structure including three-dimensional NOR memory strings of junctionless ferroelectric memory transistors, substantially as shown in and/or described below, for example in connection with at least one of the figures, as set forth more completely in the claims.

In some embodiments, a process suitable for use in fabricating a memory structure including storage transistors configured in a NOR memory string above a planar surface of a semiconductor substrate includes: above the planar surface, repeatedly depositing, alternately and one over another, a multilayer and an inter-layer sacrificial layer, each multilayer comprising first and second sacrificial layers and a first isolation layer between the first and second sacrificial layers; forming a first set of trenches in the multilayers and the inter-layer sacrificial layers, each trench having (i) a depth that extends along a first direction that is substantially normal to the planar surface, (ii) a length that extends along a second direction that is substantially parallel to the planar surface, (iii) a width that extends along a third direction that is substantially orthogonal to the depth and the length, the length of the trench being substantially greater than its width; forming a first liner layer on the sidewalls of the first set of trenches; forming an oxide semiconductor layer on the first liner layer; forming a second liner layer on the oxide semiconductor layer; filling remaining volume of the first set of trenches with a sacrificial filler material; forming dielectric filled shafts between the sacrificial filler material in the first set of trenches, each dielectric filled shaft including a dielectric material formed between the first liner layer disposed on opposite sidewalls of the respective trench; forming gate electrode structures between the dielectric filled shafts in the first set of trenches, each gate electrode structure comprising: (i) a ferroelectric dielectric layer formed on the oxide semiconductor layer; and (ii) a gate conductor layer formed on the ferroelectric dielectric layer.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

DETAILED DESCRIPTION OF THE INVENTION

Figure 1A:
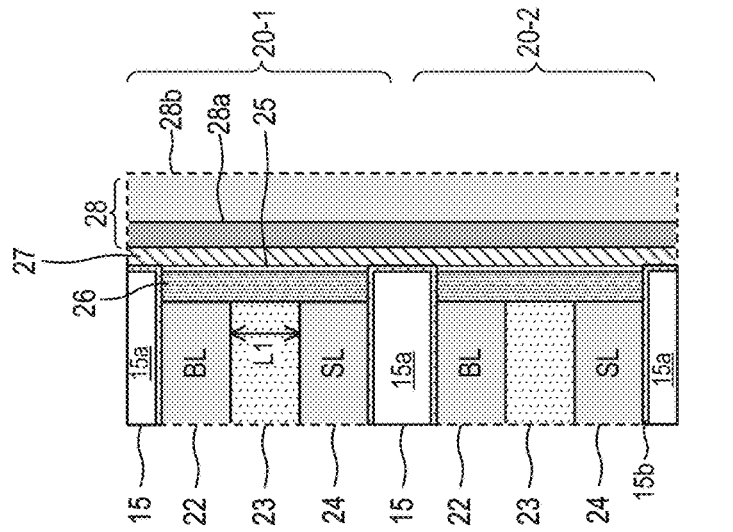
FIG. 1(a), is a perspective view of a memory structure including a 3-dimensional array of NOR memory strings in some embodiments.

In embodiments of the present invention, a fabrication process for a memory structure including three-dimensional arrays of thin-film ferroelectric storage transistors is disclosed. In some embodiments, the ferroelectric storage transistors are organized in three-dimensional arrays of horizontal NOR memory strings. In one aspect of the present invention, the fabrication process uses a liner underlayer in the deposition process of the channel layer where the liner underlayer provides a uniform surface for the deposition of the channel layer and also serves as an etch stop layer in the subsequent metal replacement process. In another aspect of the present invention, the fabrication process applies a liner layer in vertical shafts during the local word line process to reduce or eliminate irregular features in the local word line structures, thereby enhancing the electrical characteristics and reliability of the memory arrays thus formed.

In some embodiments, the ferroelectric storage transistors are thin-film ferroelectric field-effect transistors (FeFETs) having a ferroelectric polarization layer as a gate dielectric layer. The ferroelectric polarization layer, also referred to as a "ferroelectric gate dielectric layer", is formed adjacent an oxide semiconductor layer as a channel region. The ferroelectric storage transistors include source and drain regions—both formed of a metallic conductive material—in electrical contact with the oxide semiconductor channel region. The ferroelectric storage transistors thus formed are each a junctionless transistor without a p/n junction in the channel and in which the threshold voltage is modulated by the polarization of the mobile carriers in the ferroelectric polarization layer. In the memory structure of the present invention, the ferroelectric storage transistors in each NOR memory string are controlled by individual control gate electrodes to allow each storage transistor to be individually addressed and accessed. In some embodiments, the ferroelectric polarization layer is formed of a doped hafnium oxide material and the oxide semiconductor channel region is formed of an amorphous metal oxide semiconductor material.

In the present description, the term "storage transistor" is used interchangeably with "memory transistor" to refer to the transistor device formed in the memory structure described herein. In some examples, the memory structure of the present disclosure including NOR memory strings of randomly accessible storage transistors (or memory transistors) can have applications in computing systems as the main memory where the memory locations are directly accessible by the processors of the computer systems, for instance, in a role served in the prior art by conventional random-access memories (RAMs), such as dynamic RAMs (DRAMS) and static RAMs (SRAMs). For example, the memory structure of the present disclosure can be applied in computing systems to function as a random-access memory to support the operations of microprocessors, graphical processors and artificial intelligence processors. In other examples, the memory structure of the present disclosure is also applicable to form a storage system, such as a solid-state drive or replacing a hard drive, for providing long term data storage in computing systems.

In the present description, the term "oxide semiconductor layer" (sometimes also referred to as a "semiconductor oxide layer" or "metal oxide semiconductor layer") as used herein refers to thin film semiconducting materials made from a conductive metal oxide, such as zinc oxide and indium oxide, or any suitable conductive metal oxides with charge-carriers having mobilities that can be modified or modulated using suitable preparation or inclusion of suitable impurities.

In embodiments of the present invention, the memory structure includes memory stacks where each memory stack includes multiple NOR memory strings formed one on top of another in the vertical direction. In some embodiments, the stacks of NOR memory strings are formed by groups of thin films successively deposited over a planar surface of a semiconductor substrate, each group of thin films being referred to as an "active layer" in the present description. The active layers in each stack of NOR memory strings are provided one on top of another and each active layer is separated from the other active layers by an inter-layer isolation layer. Each active layer includes a common drain line and a common source line that are arranged spaced apart in the vertical direction by a channel spacer isolation layer. Both the common source line and the common drain line extend along a horizontal direction.

The storage transistors in each NOR memory string share the common source line and the common drain line. The channel layer of the storage transistors is formed on the sidewalls of the memory stacks, in contact with the common source line and the common drain line of each NOR memory string. Gate dielectric layers and gate conductor layers of the storage transistors are formed in a vertical direction in narrow operational trenches between the memory stacks to form storage transistors in multiple parallel planes of each stack, a storage transistor being formed at each intersection of a gate conductor layer and the common source line and the common drain line of a memory string. The gate conductor layers are also referred to herein as the local word lines (LWL) and the operational trenches are sometimes referred herein as "local word line trenches" or "LWL trenches." That is, the operational or LWL trenches are trenches in which the local word line gate conductors are formed and in which storage transistors are fabricated. As mentioned above, the term "vertical" refers to the direction normal to the surface of a semiconductor substrate, and the term "horizontal" refers to any direction that is parallel to the surface of that semiconductor substrate.

In the present embodiments, the storage transistors in the NOR memory strings are ferroelectric field effect transistors including a ferroelectric thin film as the gate dielectric layer, also referred to as the ferroelectric polarization layer or ferroelectric gate dielectric layer or ferroelectric dielectric layer. In a ferroelectric field effect transistor (FeFET), the polarization direction in the ferroelectric gate dielectric layer is controlled by an electric field applied between the transistor drain terminal and the transistor gate electrode, where changes in the polarization direction alters the threshold voltage of the FeFET. In some embodiments, the electric field is applied to both the transistor drain and source terminals, relative to the transistor gate electrode. For example, the FeFET may be programmed to have either one of two threshold voltages, where each threshold voltage of the FeFET can be used to encode a given logical state. For example, the two threshold voltages of the FeFET can be used to encode a "programmed" state and an "erased" state, each representing a designated logical value. In one example, the programmed state is associated with a lower threshold voltage and the erased state is associated with a higher threshold voltage. In some embodiments, more than two threshold voltages may be established to represent more than two memory states at each FeFET.

In the present description, to facilitate reference to the figures, a Cartesian coordinate reference frame is used, in which the Z-direction is normal to the planar surface of the semiconductor substrate and the X-direction and the Y-direction are orthogonal to the Z-direction and to each other, as indicated in the figures. Moreover, the drawings provided herein are idealized representations to illustrate embodiments of the present disclosure and are not meant to be actual views of any particular component, structure, or device. The drawings are not to scale, and the thickness and dimensions of some layers may be exaggerated for clarity. Variations from the shapes of the illustrations are to be expected. For example, a region illustrated as a box shape may typically have rough and/or nonlinear features. Sharp angles that are illustrated may be rounded. Like numerals refer to like components or elements throughout.

Figure 1:
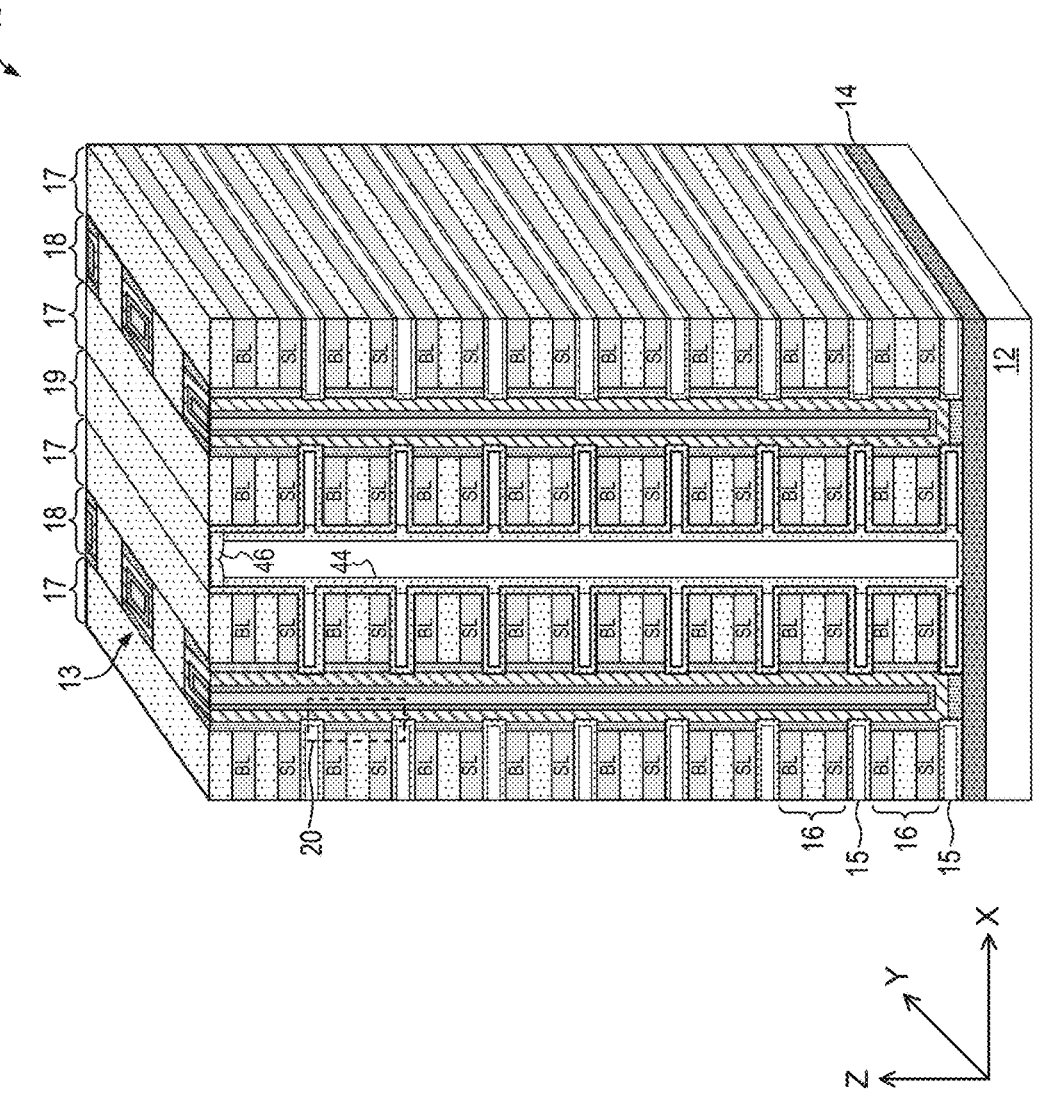
FIG. 1, which includes

FIG. 1, which includes FIG. 1(a), is a perspective view of a memory structure including a 3-dimensional array of NOR memory strings in some embodiments. The memory structure can be used to implement part of a semiconductor memory device in some examples. Referring to FIG. 1, a memory structure 10 includes a number of active layers 16 formed on a planar surface of a semiconductor substrate 12. An insulating layer 14 may be provided between the semiconductor substrate 12 and the active layers 16 formed on the substrate. The active layers 16 are formed one on top of another in the Z-direction (i.e., along a direction normal to the planar surface of the substrate 12) and separated from each other by an inter-layer isolation layer 15. The active layers 16 are divided in the X-direction into narrow strips ("active strips") that are stacked one on top of another to form stacks 17 of active strips ("active stacks") extending in the Y-direction. The stacks 17 are also referred to as memory stacks in the present description.

In the present embodiment, the active stacks 17 of the memory structure 10 are separated by narrow trenches including operational trenches 18 (also referred to as "LWL trenches") and auxiliary trenches 19. In particular, the active stacks 17 are separated by alternating operational trenches 18 and auxiliary trenches 19. In the present description, operational trenches 18 are narrow trenches between active stacks 17 in which the local word line structures are provided and storage transistors are formed. Auxiliary trenches 19 are narrow trenches between active stacks 17 where no storage transistors are formed.

Each active layer 16 includes first and second low resistivity conductive layers (e.g., titanium nitride (TiN)-lined tungsten (W)) separated by a channel spacer isolation layer, also referred to as a channel spacer dielectric layer, (e.g., silicon dioxide or $SiO_2$). During intermediate processing steps, the active layer may include sacrificial layers (e.g., silicon nitride) to be subsequently replaced by conductive layers. Subsequent processing steps form the channel layers, the gate dielectric layers, and the gate conductor layers in the operational trenches 18 between the separated active stacks. The gate conductor layers and the gate dielectric layers are formed as columnar structures extending in the Z-direction. In the present description, the gate conductor layers are also referred to as "local word lines" and the gate conductor layer with a gate dielectric layer is collectively referred to a local word line (LWL) structure 13. The first and second conductive layers of each active strip form a drain region ("common bit line") and a source region ("common source line"), respectively, of the storage transistors. In the present embodiment, the storage transistors are formed along the vertical side of the active stacks 17 facing the operational trenches 18. In particular, a storage transistor 20 is formed at the intersection of an active strip with the channel layer and an LWL structure 13. The local word line structures 13 in each trench 18 are separated from each other by a dielectric-filled shaft.

FIG. 1(a) illustrates the detail construction of the storage transistor 20 formed in the memory structure 10 in some embodiments. In particular, FIG. 1(a) illustrates a pair of storage transistors 20-1 and 20-2 in two adjacent planes of an active stack 17, also referred to as a memory stack. Referring to FIG. 1(a), the storage transistor 20 includes a first conductive layer 22 forming the drain region (the common drain line or the common bit line) and a second conductive layer 24 forming the source region (the common source line), the conductive layers being spaced apart by the channel spacer dielectric layer 23. The storage transistor 20 further includes the channel layer 26 formed vertically along the sidewall of the memory stack and in contact with both the first conductive layer 22 and the second conductive layer 24. The gate dielectric layer 27 and the gate conductor layer 28 are formed on the sidewall of the memory stack. The storage transistor 20 is isolated from adjacent storage transistors in the stack by an inter-layer isolation layer 15. As thus configured, along each active strip (in the Y-direction), the storage transistors that share the common source line and the common bit line form a NOR memory string (referred herein as a "Horizontal NOR memory string" or "HNOR memory string").

In embodiments of the present invention, the storage transistors in the memory structure 10 are junctionless ferroelectric storage transistors. Accordingly, each storage transistor 20 includes only conductive layers as the source and drain regions, without any semiconductor layers. The first and second conductive layers are formed using a low resistivity metallic conductive material. In some embodiments, the first and second conductive layers are metal layers, such as a titanium nitride (TiN)-lined tungsten (W) layer, a tungsten nitride (WN)-lined tungsten (W) layer, a molybdenum nitride (MoN) lined molybdenum (Mo) layer, or a liner-less tungsten or molybdenum or cobalt layer, or other metal layers. The channel spacer dielectric layer 23 between the first and second conductive layers may be a dielectric layer, such as silicon dioxide ($SiO_2$). The channel layer 26 is an oxide semiconductor layer. In some examples, the channel layer 26 is formed using an amorphous oxide semiconductor material, such as indium gallium zinc oxide (InGaZnO or IGZO), indium zinc oxide (IZO), indium tungsten oxide (IWO), or indium tin oxide (ITO), or other such oxide semiconductor materials. An oxide semiconductor channel region has the advantage of a high mobility for greater switching performance and without concern for electron or hole tunneling. For example, an IGZO film has an electron mobility of 10.0-100.0 $cm^2/V$, depending on the relative compositions of indium, gallium, zinc and oxygen.

To form the ferroelectric storage transistor, the storage transistor 20 includes a ferroelectric polarization layer 27 in contact with the channel layer 26. The ferroelectric polarization layer 27 (or "ferroelectric dielectric layer") serves as the storage layer of the storage transistor. In some embodiments, an interfacial layer 25 may be provided between the oxide semiconductor channel layer 26 and the ferroelectric polarization layer 27. The interfacial layer 25 is a thin layer and may be 0.5 nm to 2 nm thick. In some embodiments, the interfacial layer is formed using a material with a high dielectric constant (K) (also referred to as "high-K" material). In some embodiments, the interfacial layer 25 may be a silicon nitride ($Si_3N_4$) layer, or a silicon oxynitride layer, or an aluminum oxide ($Al_2O_3$) layer. In one example, the interfacial layer, if present, may have a thickness of 1.5 nm when the ferroelectric polarization layer has a thickness of 4-5 nm. The inclusion of the interfacial layer 25 in FIG. 1($a$) is illustrative only and not intended to be limiting. The interfacial layer 25 is optional and may be omitted in other embodiments of the present invention. In other embodiments, the interfacial layer 25, when included, may be formed as a multi-layer of different dielectric materials. In the present description, a material with a high dielectric constant or a "high-K material" refers to a material with a dielectric constant larger than the dielectric constant of silicon dioxide or larger than a dielectric constant of 3.9.

In some embodiments, the ferroelectric polarization layer is formed of a doped hafnium oxide material, such as zirconium-doped hafnium oxide (HfZrO or "HZO"). In other embodiments, the hafnium oxide can be doped with silicon (Si), iridium (Ir) or lanthanum (La). In some embodiments, the ferroelectric polarization layer is a material selected from: zirconium-doped hafnium oxide (HZO), silicon-doped hafnium oxide (HSO), aluminum zirconium-doped hafnium oxide (HfZrAlO), aluminum-doped hafnium oxide ($HfO_2$:Al), lanthanum-doped hafnium oxide ($HfO_2$:La), hafnium zirconium oxynitride (HfZrON), hafnium zirconium aluminum oxide (HfZrAlO), and any hafnium oxide that includes zirconium impurities.

The ferroelectric polarization layer contacts the channel layer 26 on one side and the gate conductor layer 28 on the opposite side. In some embodiments, the gate conductor layer 28 includes a conductive liner 28$a$ as an adhesion layer and a low resistivity conductor 28$b$. In some examples, the conductive liner 28$a$ is a titanium nitride (TiN) layer, a tungsten nitride (WN) layer, or a molybdenum nitride (MoN), and the conductor 28$b$ is formed using tungsten or molybdenum, or other metals. In some cases, the conductive liner 28$a$ is not needed and the gate conductor layer 28 includes only the low resistivity conductor 28$b$, such as a liner-less tungsten or molybdenum layer. In other examples, the conductor 28$b$ can be heavily doped n-type or p-type polysilicon, which can be used with or without the conductive liner. The gate conductor layer 28, including the conductive liner 28$a$ (if any) and the conductor 28$b$, together forms the control gate electrode of the storage transistor and functions as the local word line in the memory structure.

As thus constructed, the oxide semiconductor channel layer 26 forms an N-type, unipolarity channel region where the conductive layers 22, 24, forming the drain and source terminals, directly contact the channel region. The ferroelectric storage transistor thus formed is a depletion mode device where the transistor is normally on (i.e., conducting) and can be turned off (i.e., non-conducting) by depleting the N-type carriers in the channel region. The threshold voltage of the ferroelectric storage transistor is a function of the thickness (X-direction) of the oxide semiconductor channel layer 26. That is, the threshold voltage of the ferroelectric storage transistor is the amount of voltage necessary to deplete the carriers within the thickness of the oxide semiconductor channel region to shut off the ferroelectric storage transistor.

Each storage transistor 20 is isolated from adjacent storage transistors along an active stack (in the Z-direction) by the inter-layer isolation layer 15. In the present embodiment, the inter-layer isolation layer 15 is an air gap isolation formed by an air gap cavity 15$a$ and an optional air gap liner 15$b$. The air gap liner 15$b$ is a dielectric layer used to cover or passivate the exposed surface of the air gap cavity 15$a$. In some embodiments, the air gap liner 15$b$ is a silicon nitride layer or an aluminum oxide ($Al_2O_3$) layer. The air gap liner 15$b$ may be 1 nm-3 nm thick. In FIG. 1($a$), elements are sometimes exaggerated in size for illustrative purposes only. It is understood that the depictions in this and other figures are not necessarily to scale. The air gap cavities 15$a$ forming the inter-layer isolation layer 15 provides effective isolation between adjacent storage transistors 20 along a memory stack. In embodiments of the present invention, the inter-layer isolation layer 15 is also used to provide physical separation between the channel layer 26 of one storage transistor and the channel layer of the storage transistors above or below it in the same memory stack, thereby providing isolation of each storage transistor in a memory stack.

Returning to FIG. 1, in the exemplary embodiment as shown, the memory structure 10 includes a dielectric layer 44 which serves as a capping layer to cap the air gap cavities 15$a$. In some embodiments, the dielectric layer 44 is a non-conformally deposited dielectric layer, such as a silicon dioxide ($SiO_2$) layer or silicon nitride ($Si_3N_4$), and is formed to cap the ends of the inter-layer cavities facing the auxiliary trenches 19. The memory structure 10 further includes a dielectric layer 46 as a capping layer to cap the top portions of the auxiliary trenches 19. In some embodiments, the dielectric layer 46 is the same dielectric material as the dielectric layer 44. As thus formed, the memory structure 10 includes two levels of air gap isolation. A first level of air gap isolation is provided as the inter-layer air gap isolation 15$a$ between the active layers 16 in the memory stacks. The first level of air gap isolation provides isolation between storage transistors formed in a memory stack 17. The second level of air-gap isolation is provided in the auxiliary trenches 19 and provides isolation and reduces the parasitic capacitance between adjacent memory stacks 17.

In embodiments of the present invention, the three-dimensional array of NOR memory strings of ferroelectric storage transistors can be applied to implement a non-volatile memory device or a quasi-volatile memory device. For example, a quasi-volatile memory has an average retention time of greater than 100 ms, such as about 10 minutes or a few hours, whereas a non-volatile memory device may have a minimum data retention time exceeding 5 years. As a quasi-volatile memory, the ferroelectric storage transistor 20 may require refresh from time to time to restore the intended programmed and erased polarization states. For example, the ferroelectric storage transistors 20 in memory structure 10 may be refreshed every few minutes or hours. In particular, the ferroelectric storage transistors in the present disclosure can form a quasi-volatile memory device where the refresh intervals can be on the order of hours, significantly longer than the refresh intervals of DRAMs which require much more frequent refreshes, such as in tens of milli-seconds.

A salient feature of the ferroelectric storage transistor 20 is that the storage transistor can have a very short channel length, which is operative to increase the voltage separation between the different threshold voltages, while the memory structure 10 can be manufactured without requiring costly lithography techniques to realize the short channel length. In particular, the channel length of the ferroelectric storage transistor 20 is determined by the thickness L1 of the channel spacer dielectric layer 23 (FIG. 1(a)). The thickness L1 can be accurately controlled during the deposition of the sublayers forming the initial memory stack. The ability to control the thickness L1 by deposition process, together with the very low channel leakage of oxide semiconductor channel layer, make it possible to provide a ferroelectric storage transistor 20 with very short channel length, such as a channel length of 5 nm, without needing to employ costly lithography such as extreme ultraviolet scanners (EUV) that are necessary to pattern short channels in planar transistors. In some embodiments, the thickness L1, or the channel length of the storage transistor, can be between 5 nm and 20 nm, or between 5-7 nm.

Referring again to FIG. 1, to complete the memory circuit, various types of circuitry are formed in or at the surface of the semiconductor substrate 12 to support the operations of the HNOR memory strings. Such circuits are referred to as "circuits under array" ("CuA") and may include digital and analog circuitry such as decoders, drivers, sense amplifiers, sequencers, state machines, exclusive OR circuits, memory caches, multiplexers, voltage level shifters, voltage sources, latches and registers, and connectors, that execute repetitive local operations such as processing random address, and executing activate, erase, program, read, and refresh commands with the memory arrays formed above the semiconductor substrate 12. In some embodiments, the transistors in the CuA are built using a process optimized for the control circuits, such as an advanced manufacturing process that is optimized for forming low-voltage and faster logic circuits. In some embodiments, the CuA is built using fin field-effect transistors (FinFET) or gate-all-around field-effect transistors (GAAFET) to realize a compact circuit layer and enhanced transistor performance.

In some embodiments, the CuA provides the data path to and from the memory array and further to a memory controller that may be built on the same semiconductor substrate as the CuA. Alternatively, the memory controller may reside on a separate semiconductor substrate, in which case the CuA and the associated data path are electrically connected to the memory controller using various bonding techniques. In some examples, the memory controller includes control circuits for accessing and operating the storage transistors in the memory array connected thereto, performing other memory control functions, such as data routing and error correction, and providing interface functions with systems interacting with the memory array.

The memory structure 10 of FIG. 1 illustrates a construction of a 3-dimensional array of NOR memory strings in some embodiments. In some embodiments, the memory structure 10 is fabricated in a process that realizes advantageous features for the memory structure. First, the memory structure 10 is formed so that the storage transistors in the 3-dimensional array of NOR memory strings are individually isolated from other storage transistors. In particular each storage transistor is isolated in the vertical direction by the inter-layer isolation layer and also optionally isolated in the horizontal direction by isolating the channel layer to each local word line structure 13, as shown in FIG. 1. The performance characteristics of the storage transistors can be enhanced by individually isolating each storage transistors. Second, the channel layer can be deposited conformally and then channel separation between active layers in the memory stacks is realized by etching the channel backside through access openings formed by a sacrificial layer. This results in a simplified and more reliable process for forming the channel layer. Third, after the removal of the inter-layer sacrificial layer for channel separation, the remaining cavities between active layers can form air gap isolation between the active layers, realizing better isolation than most dielectric materials.

In embodiments of the present disclosure, the memory structure includes a memory array portion constructed as described above to form the 3-dimensional array of NOR memory strings. To complete the memory device, the memory structure includes staircase portions provided at the ends of the memory strings (in the Y-directions). The thin-film storage transistors of the NOR memory strings are formed in the memory array portion while the staircase portions, on opposite sides of the array portion, include staircase structures to provide connections through conductive vias to the common bit lines and, optionally, the common source lines, of the NOR memory strings. In some embodiments, the common source lines are pre-charged to serve as virtual voltage reference source during programming, reading and erase operations, thereby obviating the need for a continuous electrical connection with the support circuitry during such operations. In the present description, the common source lines are described as being electrically floating to refer to the absence of a continuous electrical connection to the common source lines. In embodiments of the present disclosure, various processing steps for forming staircase structures in the memory structure can be used. The processing steps for forming the staircase structures can be before, after, or interleaved with the processing steps for forming the memory array portion.

The memory structure 10 of FIG. 1 illustrates the construction of a memory array including a three-dimensional array of NOR memory strings. The memory structure 10 can be used as a building block for forming a high capacity, high density memory device. In embodiments of the present disclosure, the memory structure 10 represents a modular memory unit, referred to as a "tile," and a memory device is formed using an array of the modular memory units. In one exemplary embodiment, a memory device is organized as a two-dimensional array of tiles, arrayed along the X- and Y-directions, where each tile includes a three-dimensional array of ferroelectric storage transistors with support circuitry for each tile formed under the respective tile. More specifically, a memory device includes multiple memory arrays of thin-film ferroelectric storage transistors organized as a 2-dimensional array of "tiles" (i.e., the tiles are arranged in rows and columns) formed above a planar semiconductor substrate. Each tile can be configured to be individually and independently addressed or larger memory segments (e.g., a row of tiles or a 2-dimensional block of tiles) may be created and configured to be addressed together. In some examples, each row of tiles (a "tile row") may be configured to form an operating unit, which is referred to as a "bank." A group of banks, in turn, form a "bank group." In that configuration, the banks within a bank group may share data input and output buses in a multiplexed manner. As thus configured, the tile is a modular unit that allows flexibility in configuring the memory module to adapt to application requirements.

Figure 2A:
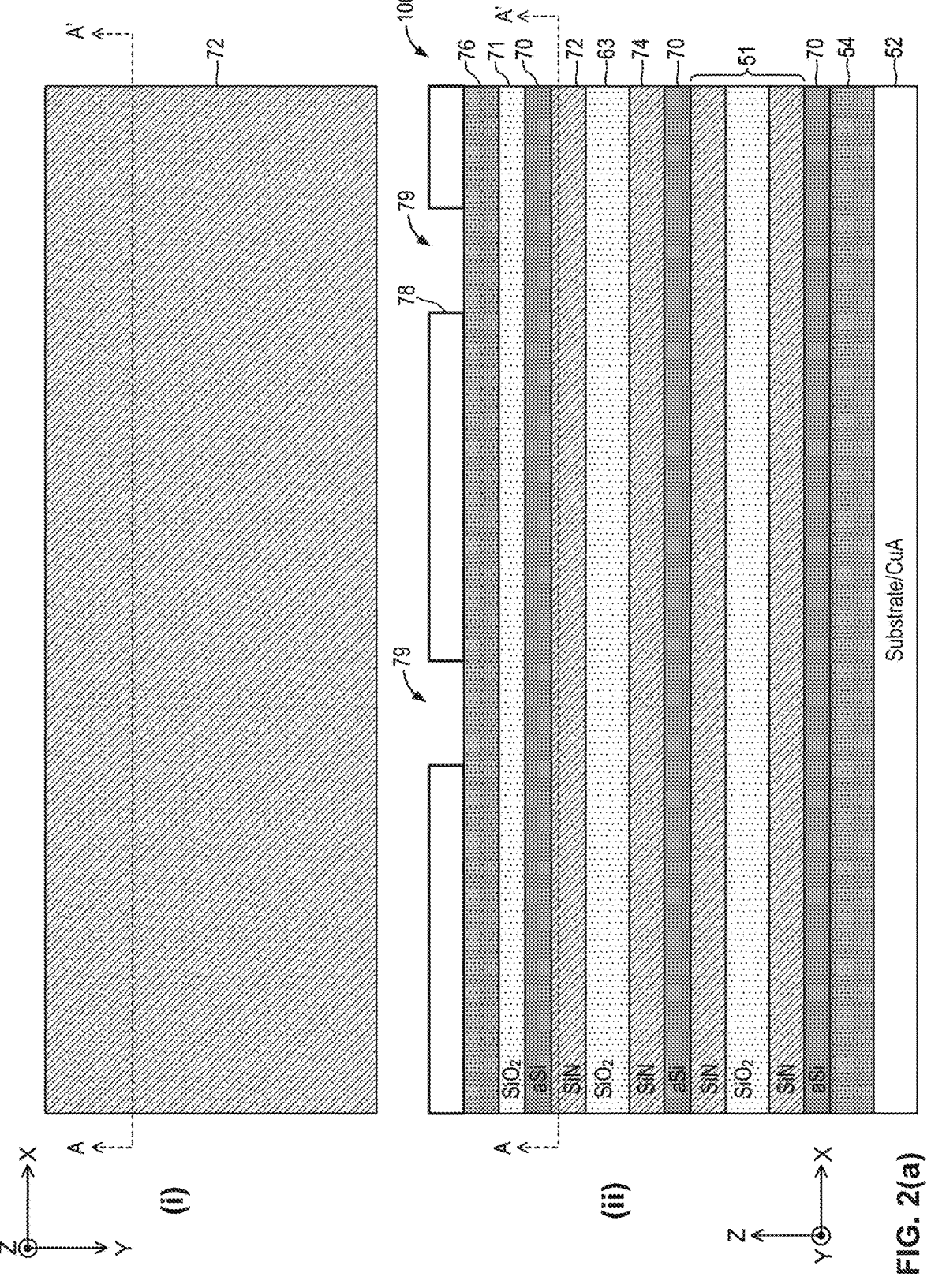
FIGS. 2(a) to 2(p), including FIGS. 2(g1) to 2(j1), illustrate a process for fabricating a memory structure including HNOR memory strings in embodiments of the present invention.
Figure 2B:
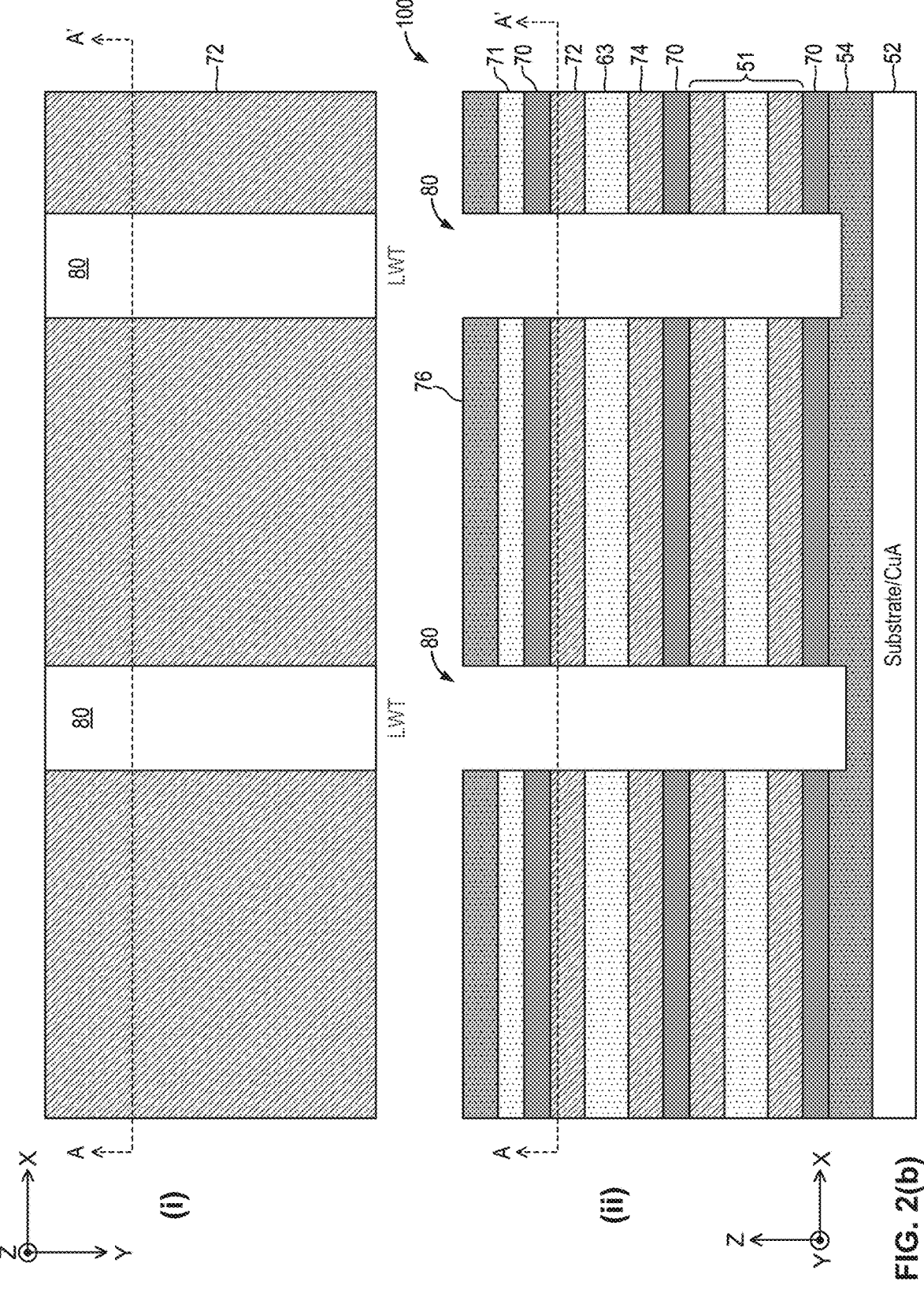
Figure 2C:
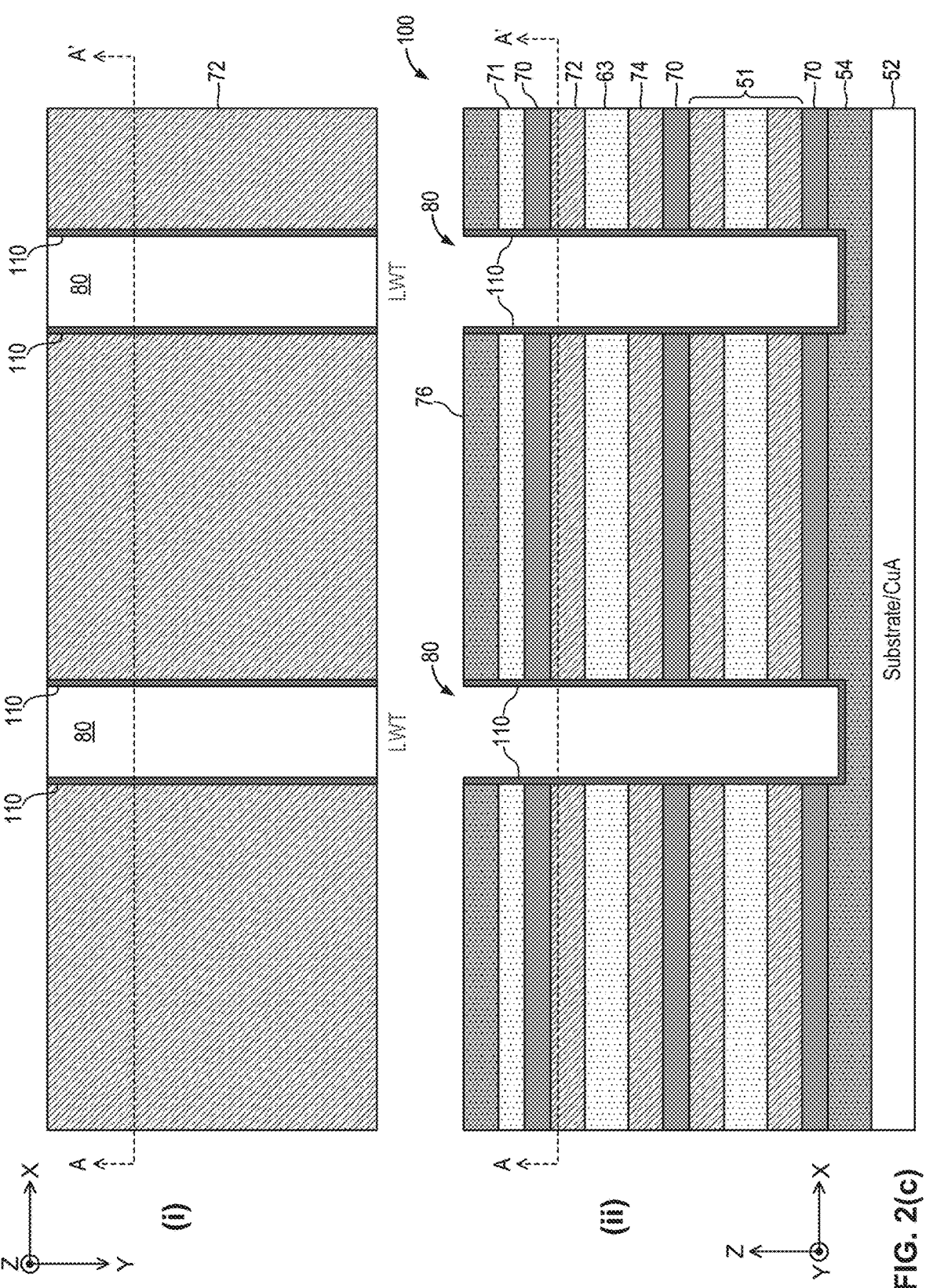
Figure 2D:
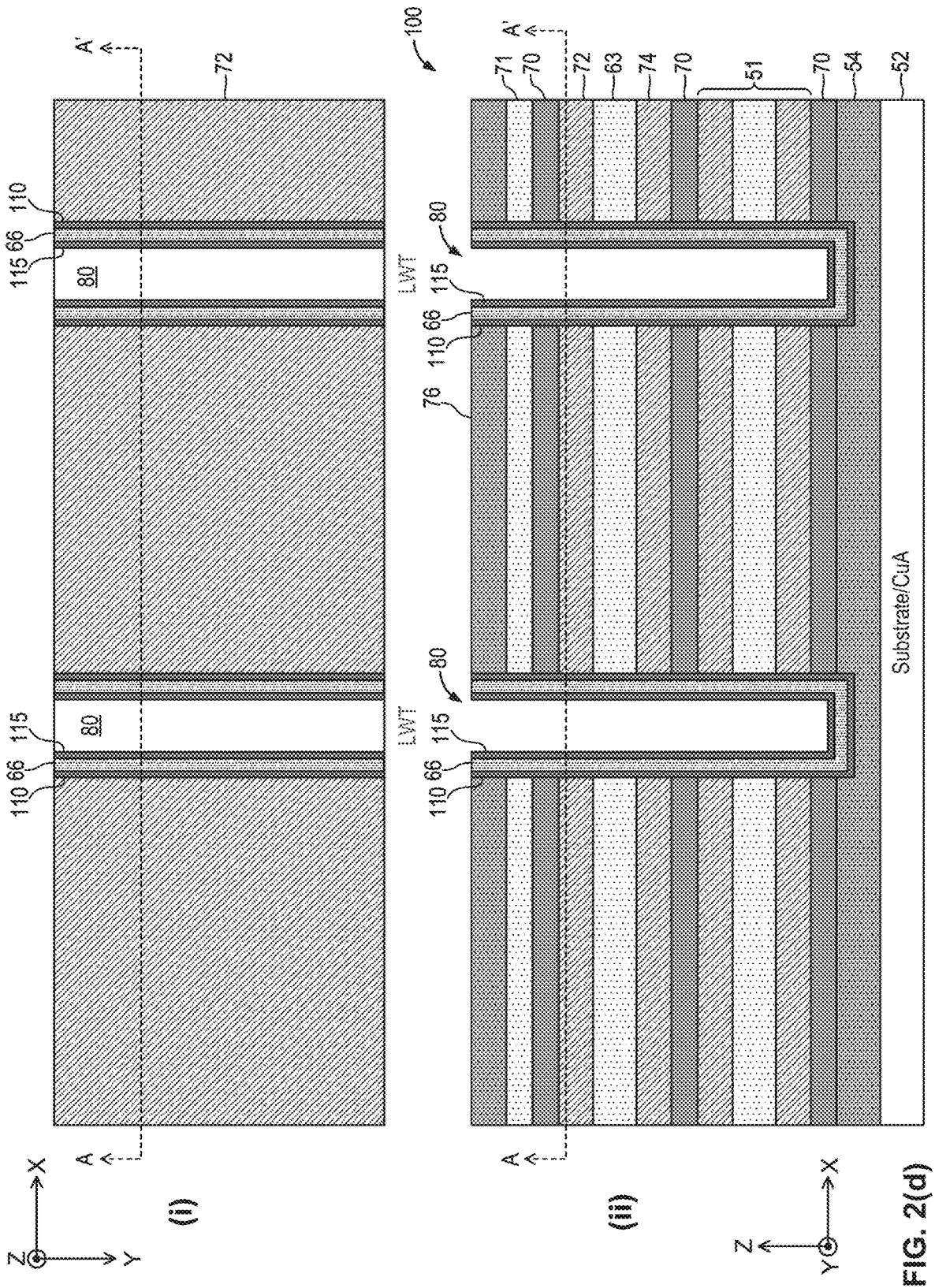
Figure 2E:
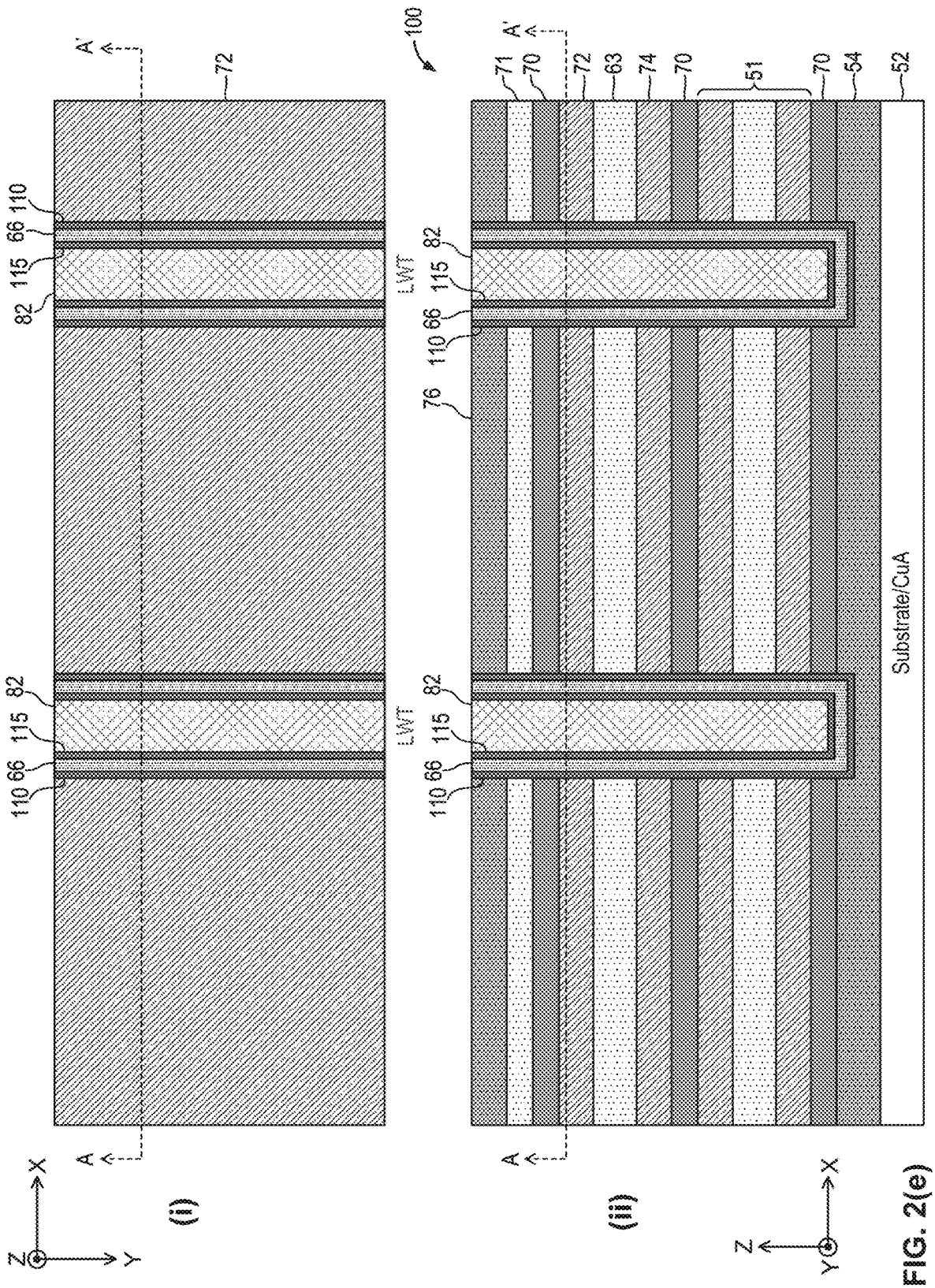
Figure 2F:
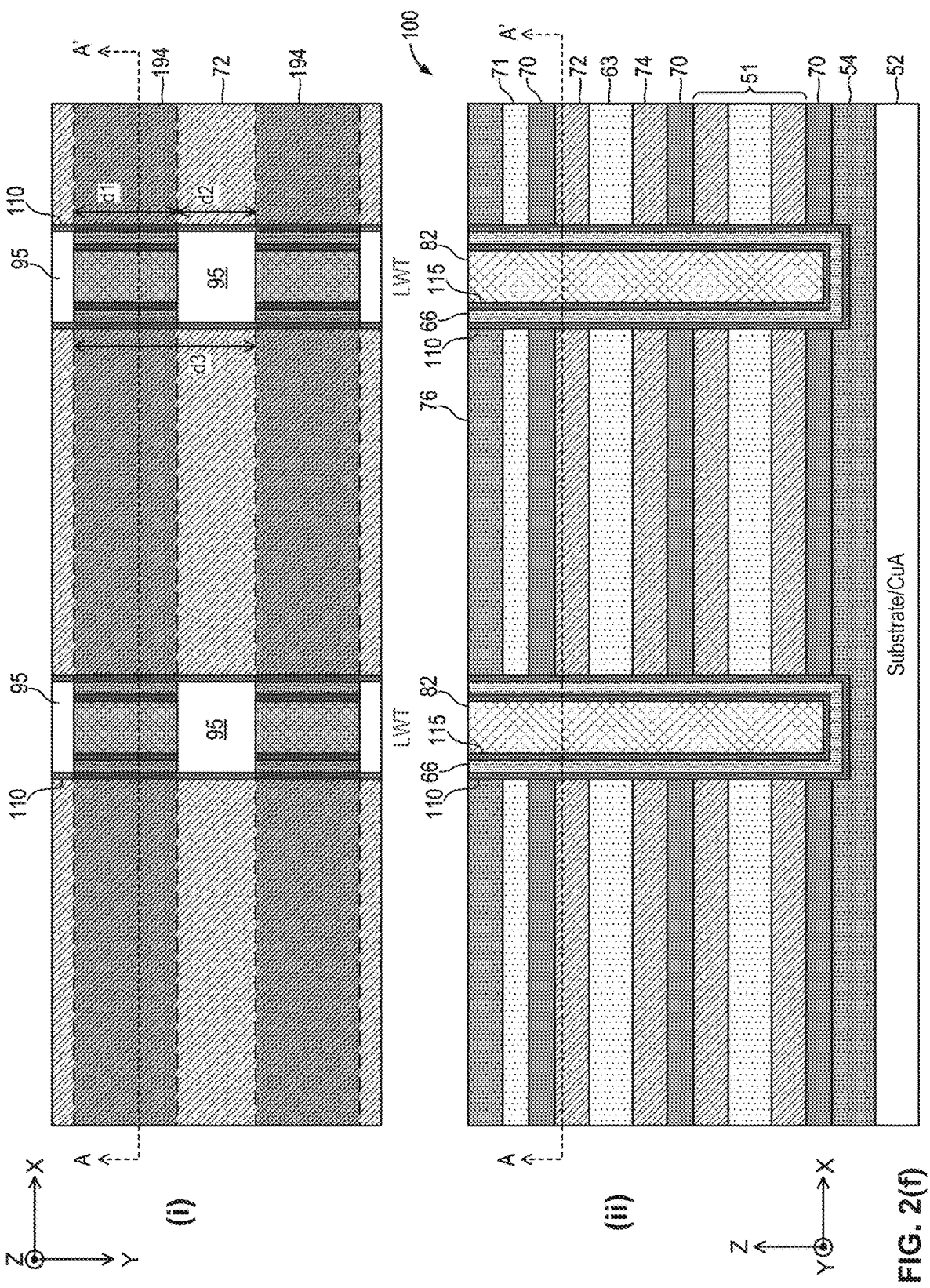
Figure 2G:
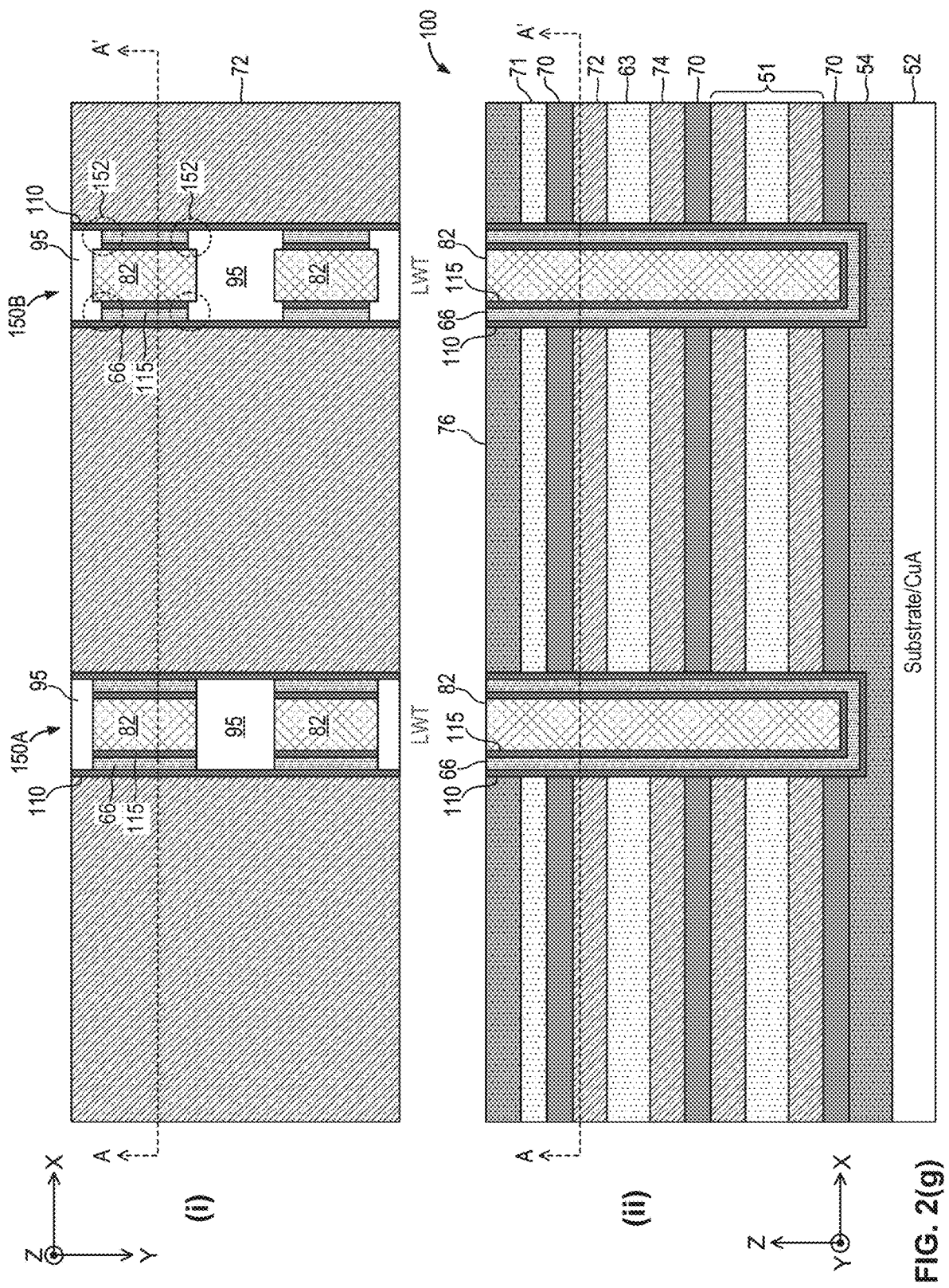
Figure 2:
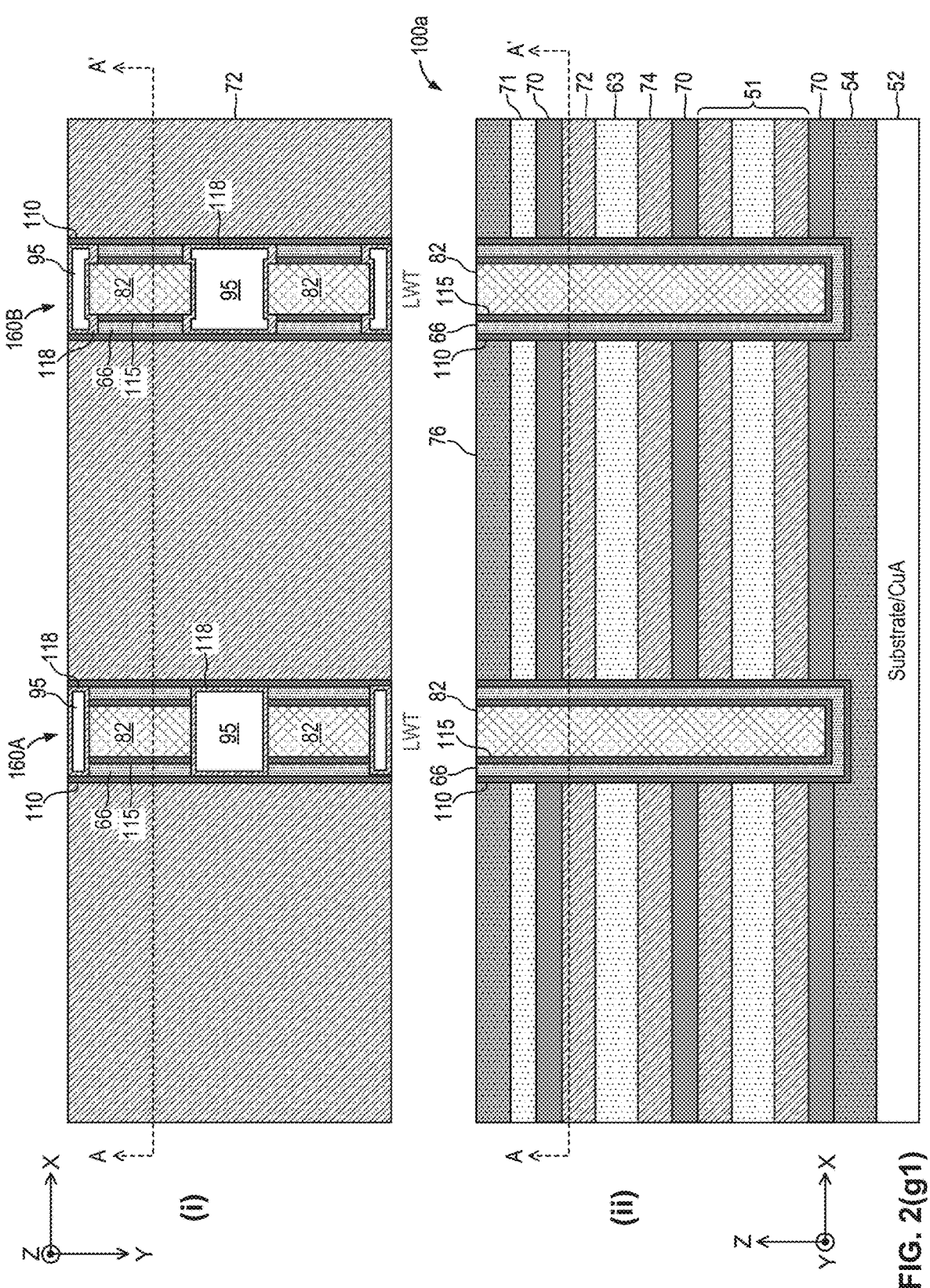
Figure 2H:
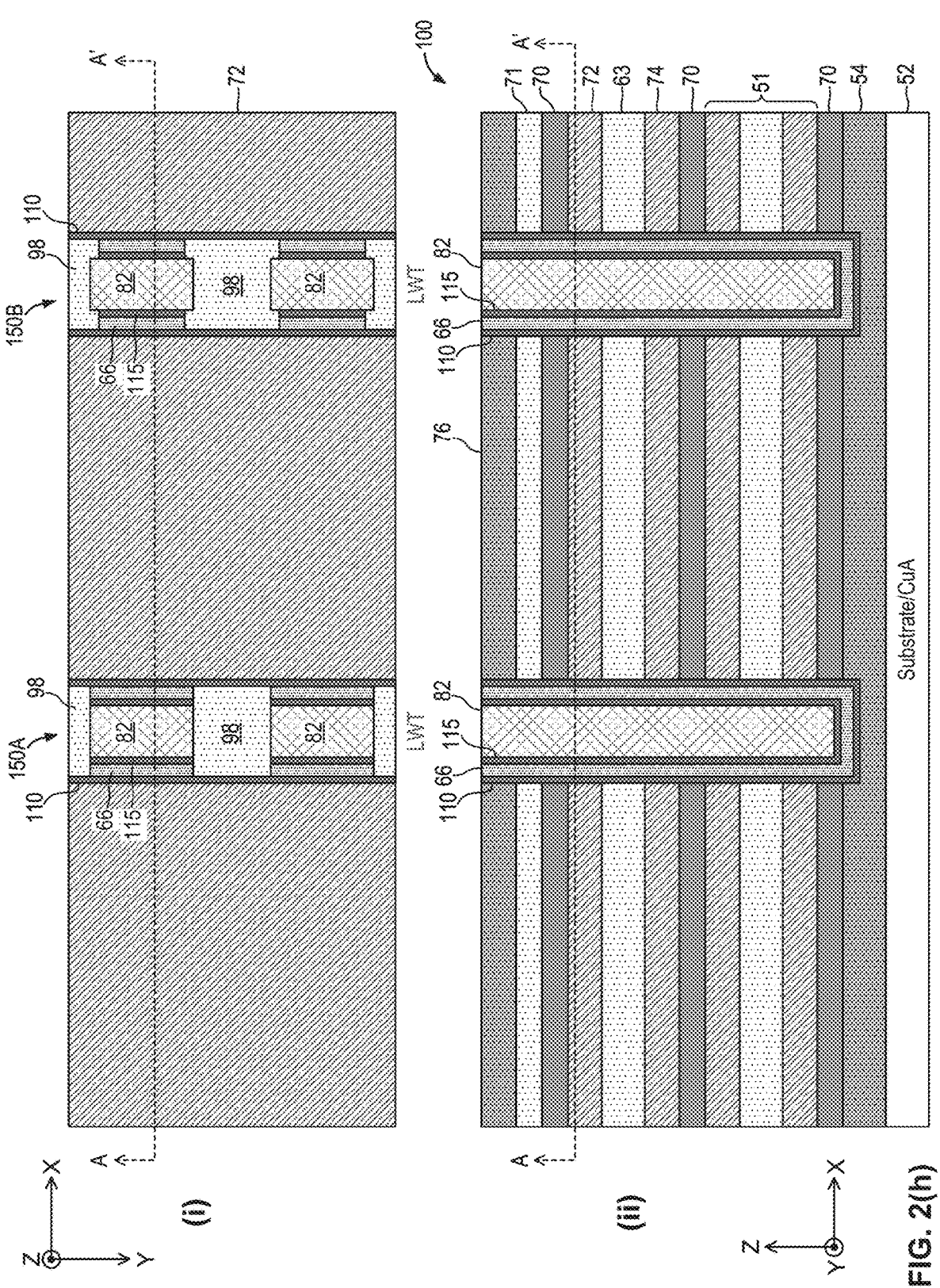
Figure 2:
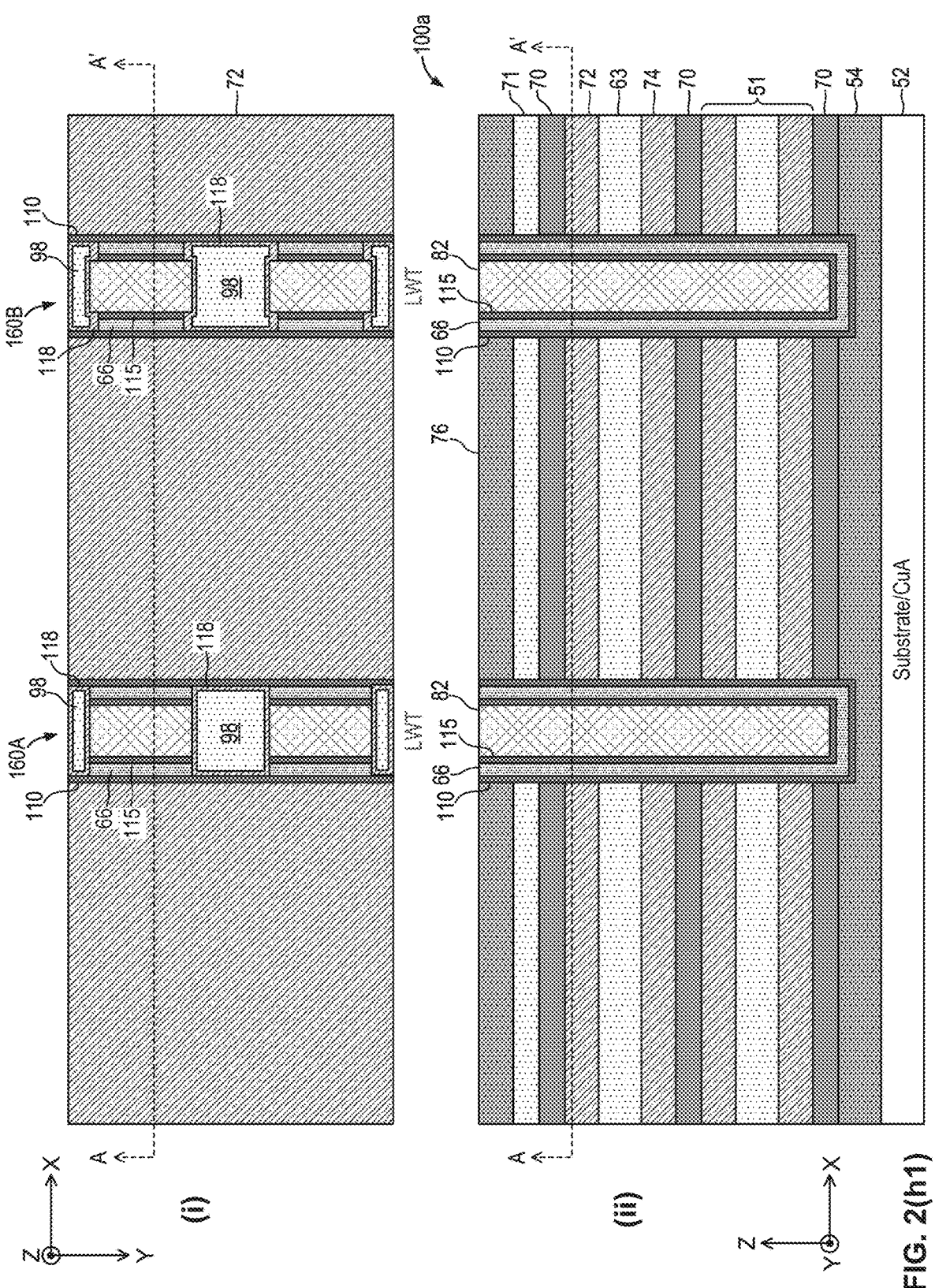
Figure 2I:
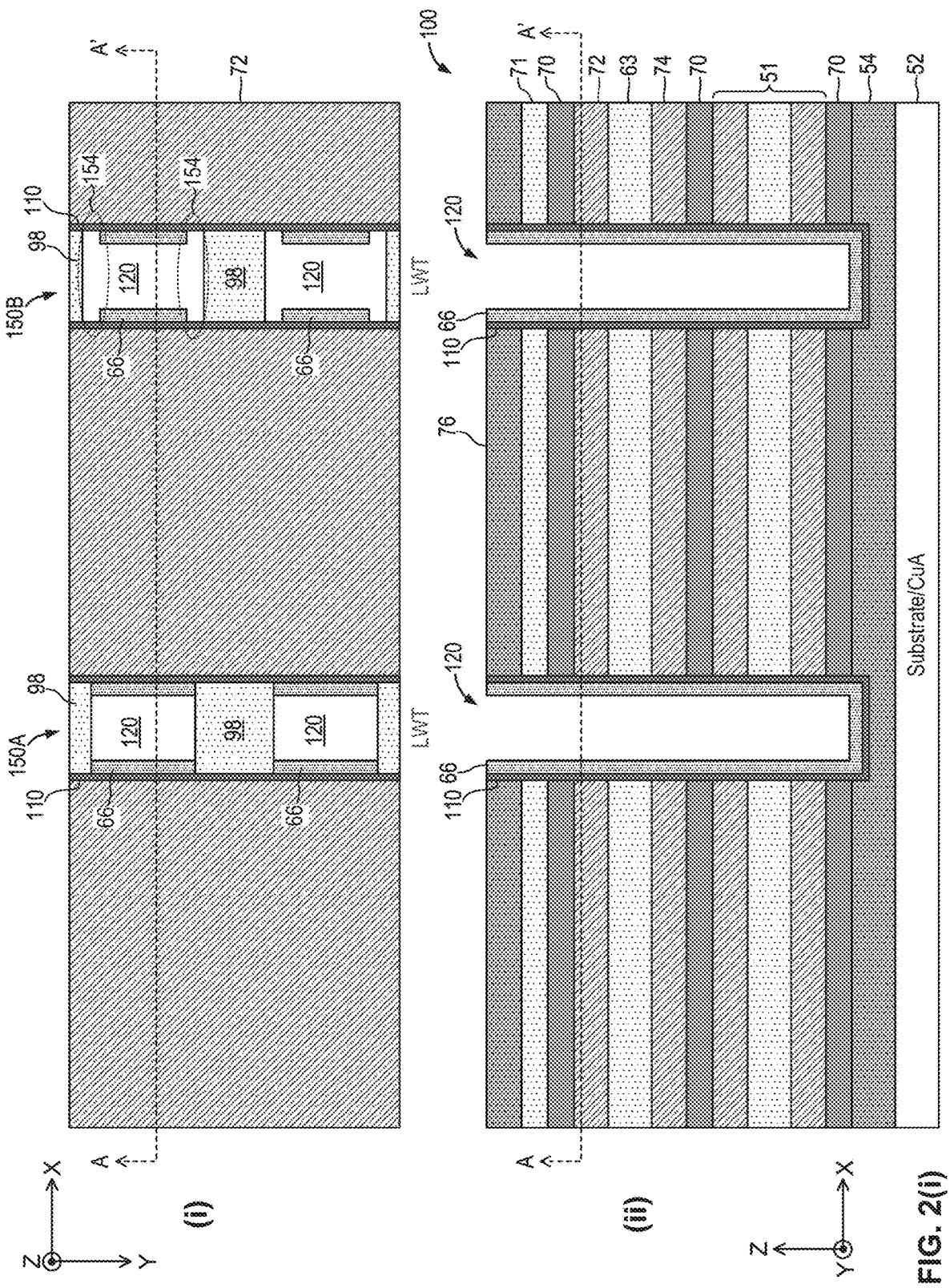
Figure 2:
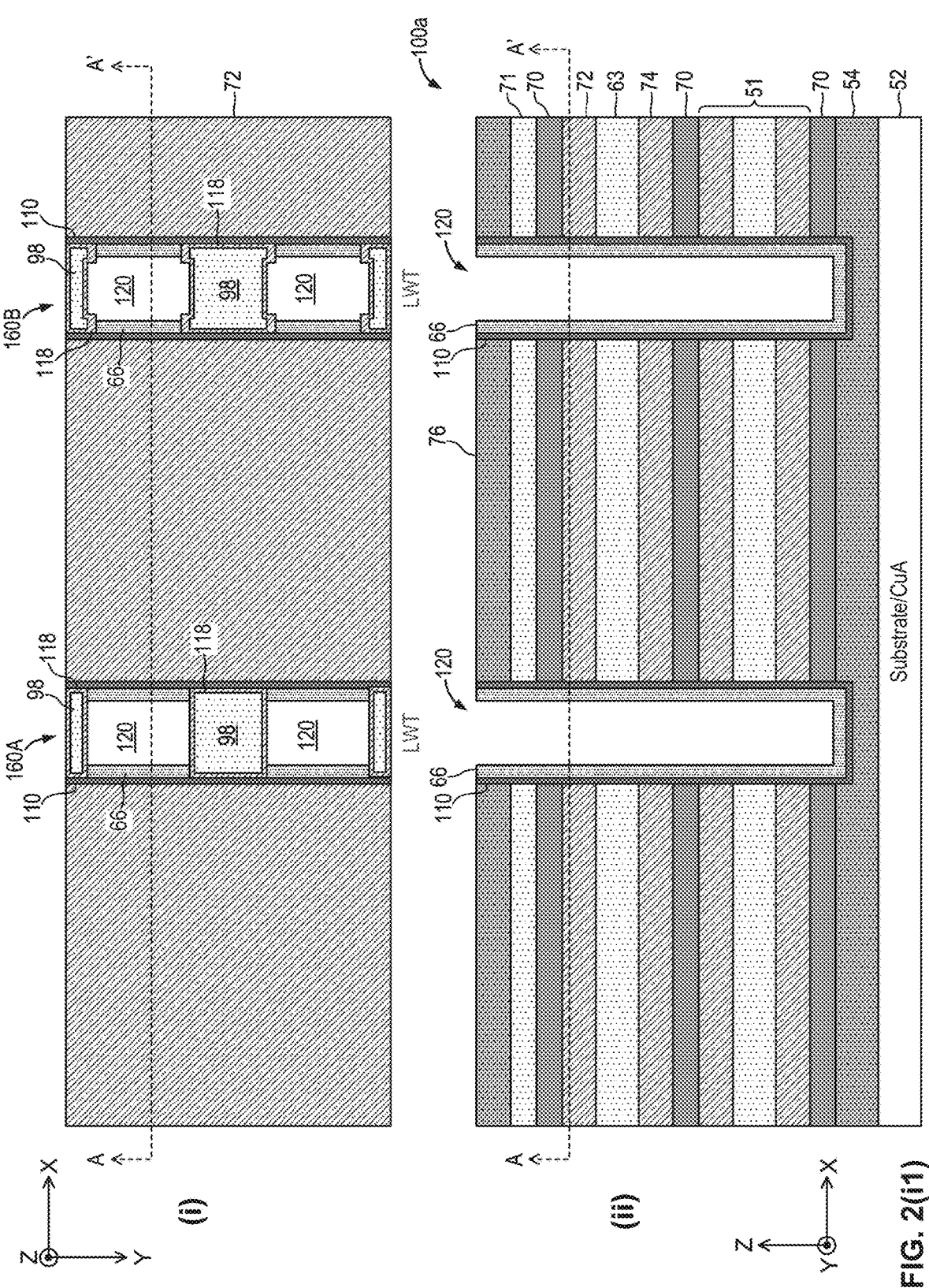
Figure 2I:
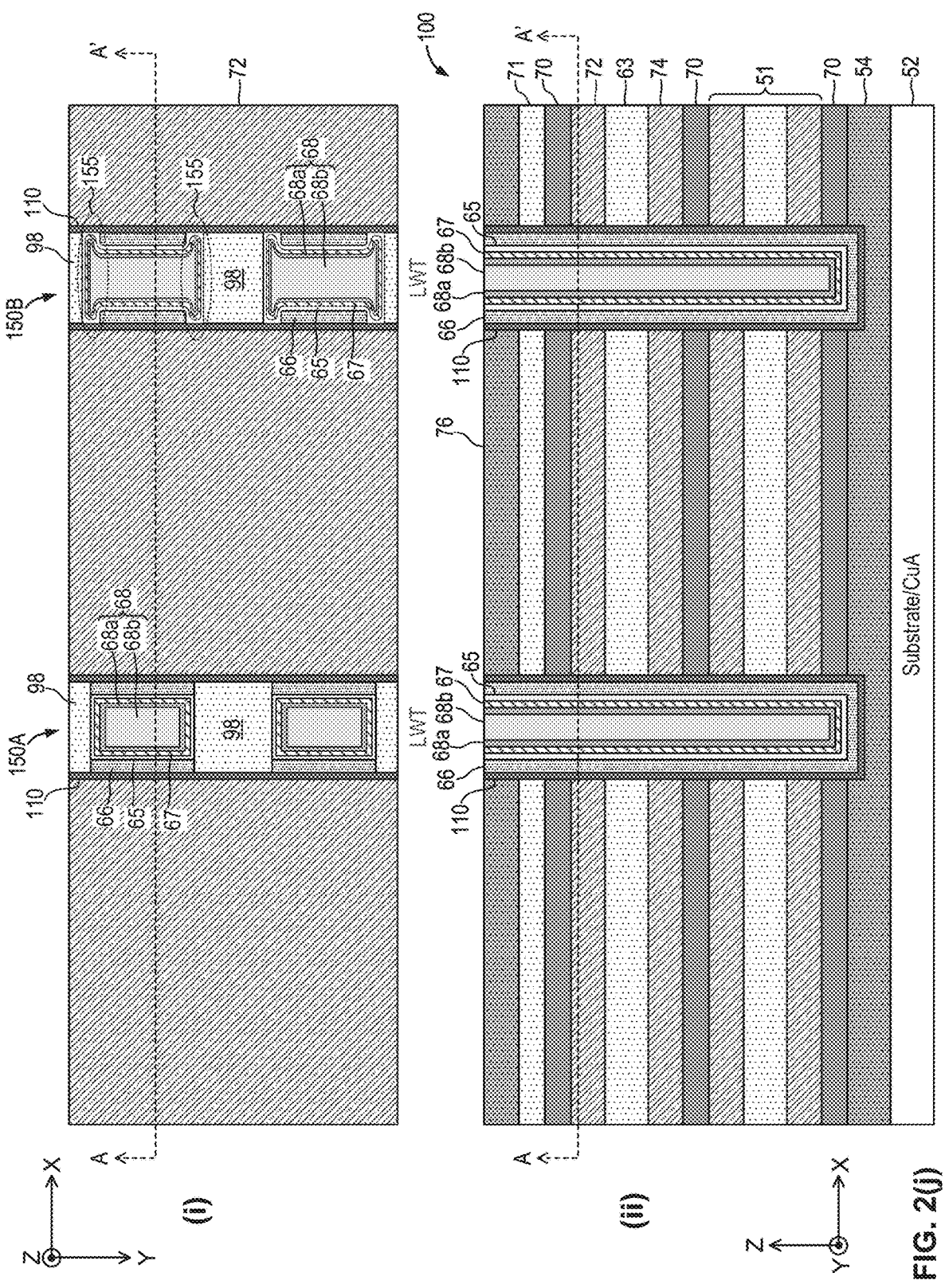
Figure 2:
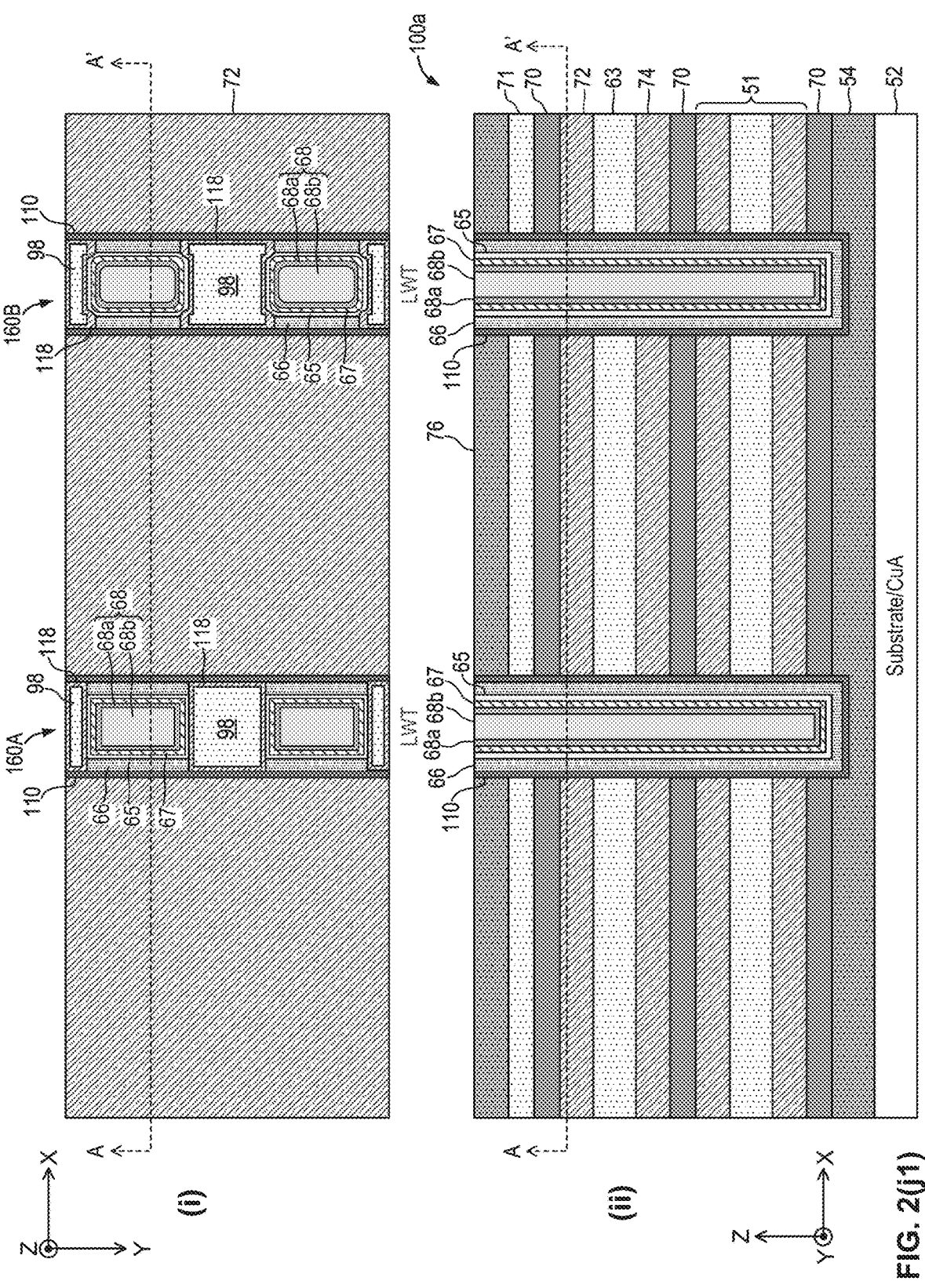
Figure 2K:
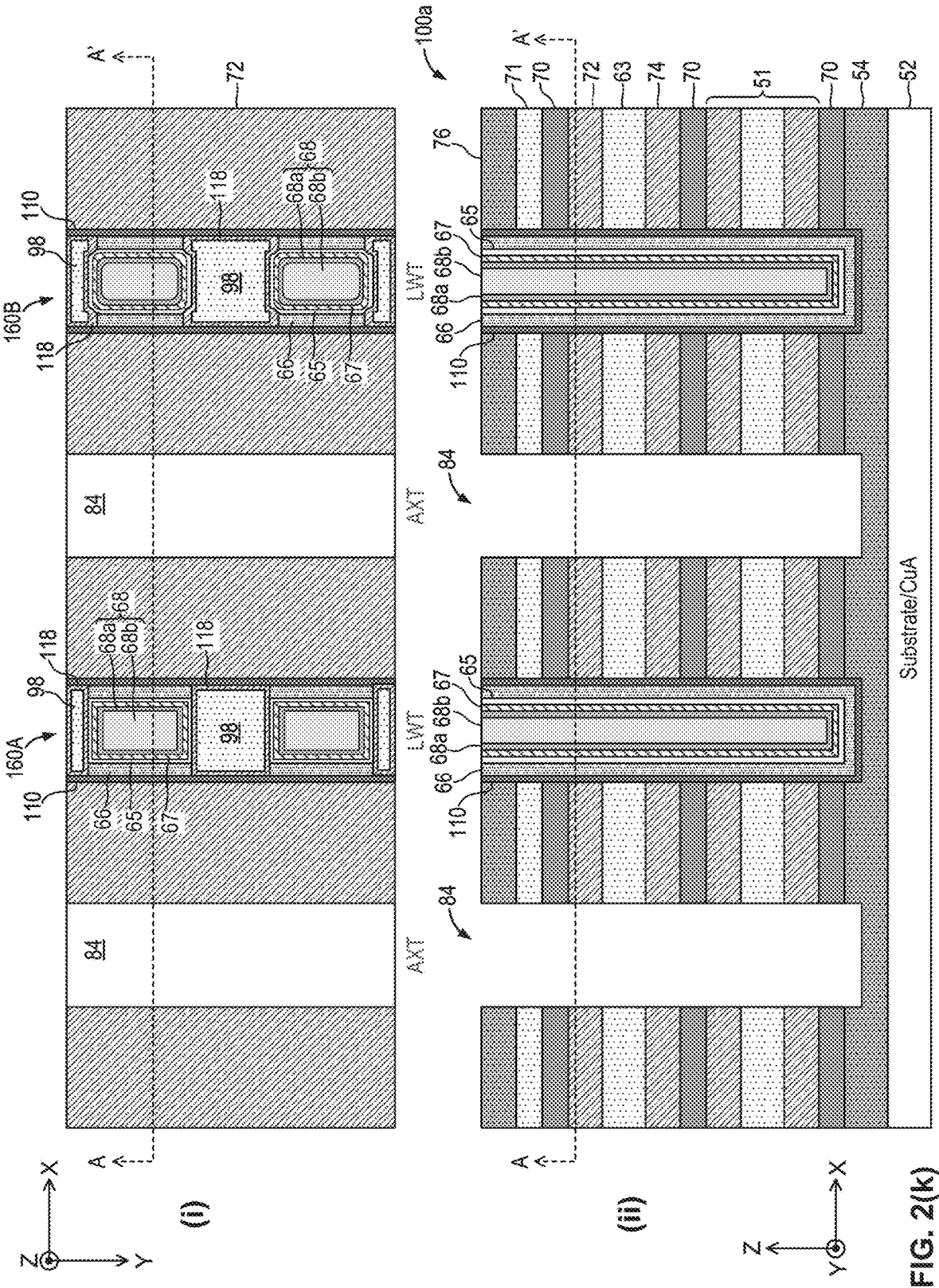
Figure 2:
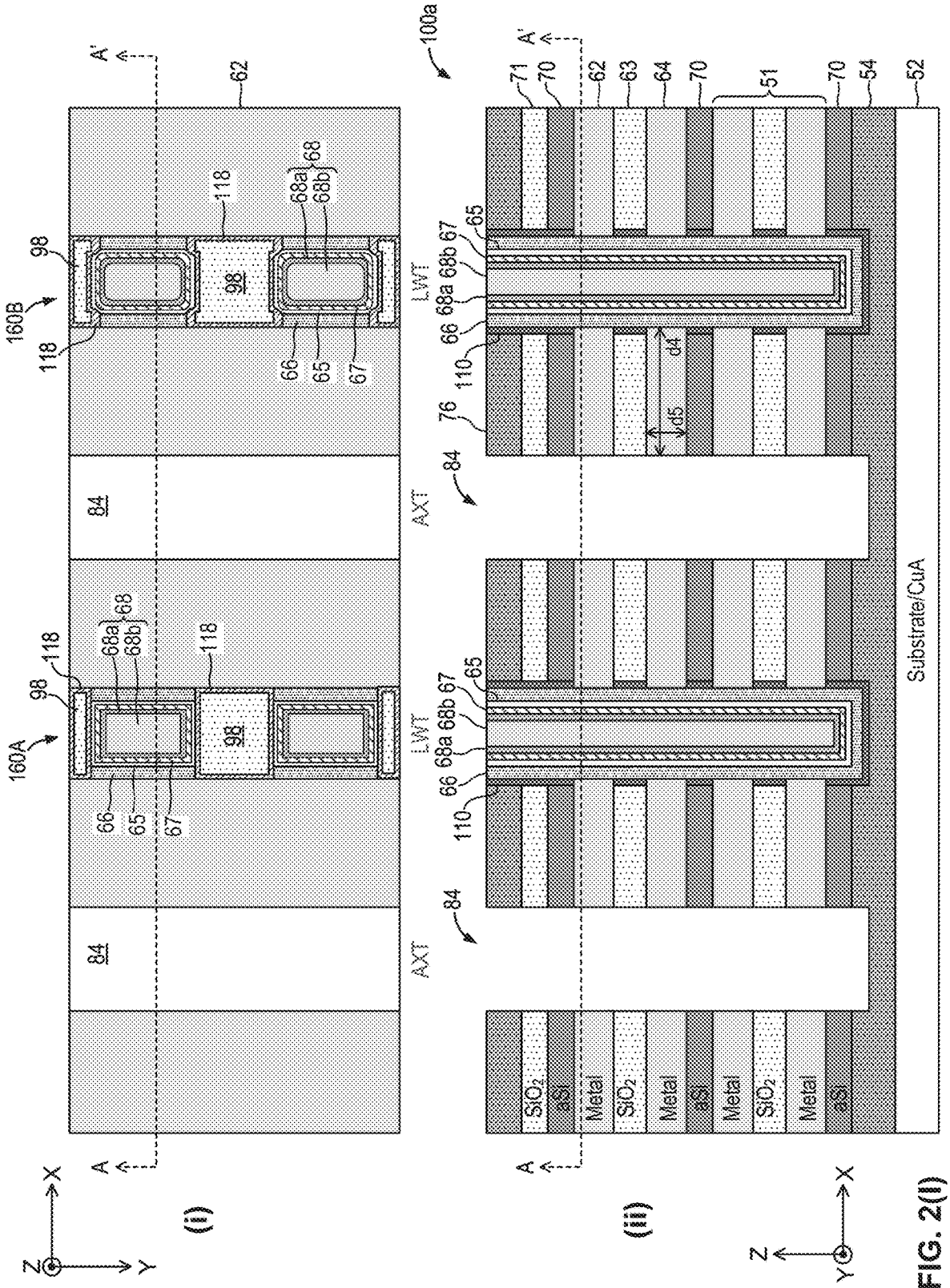
Figure 2M:
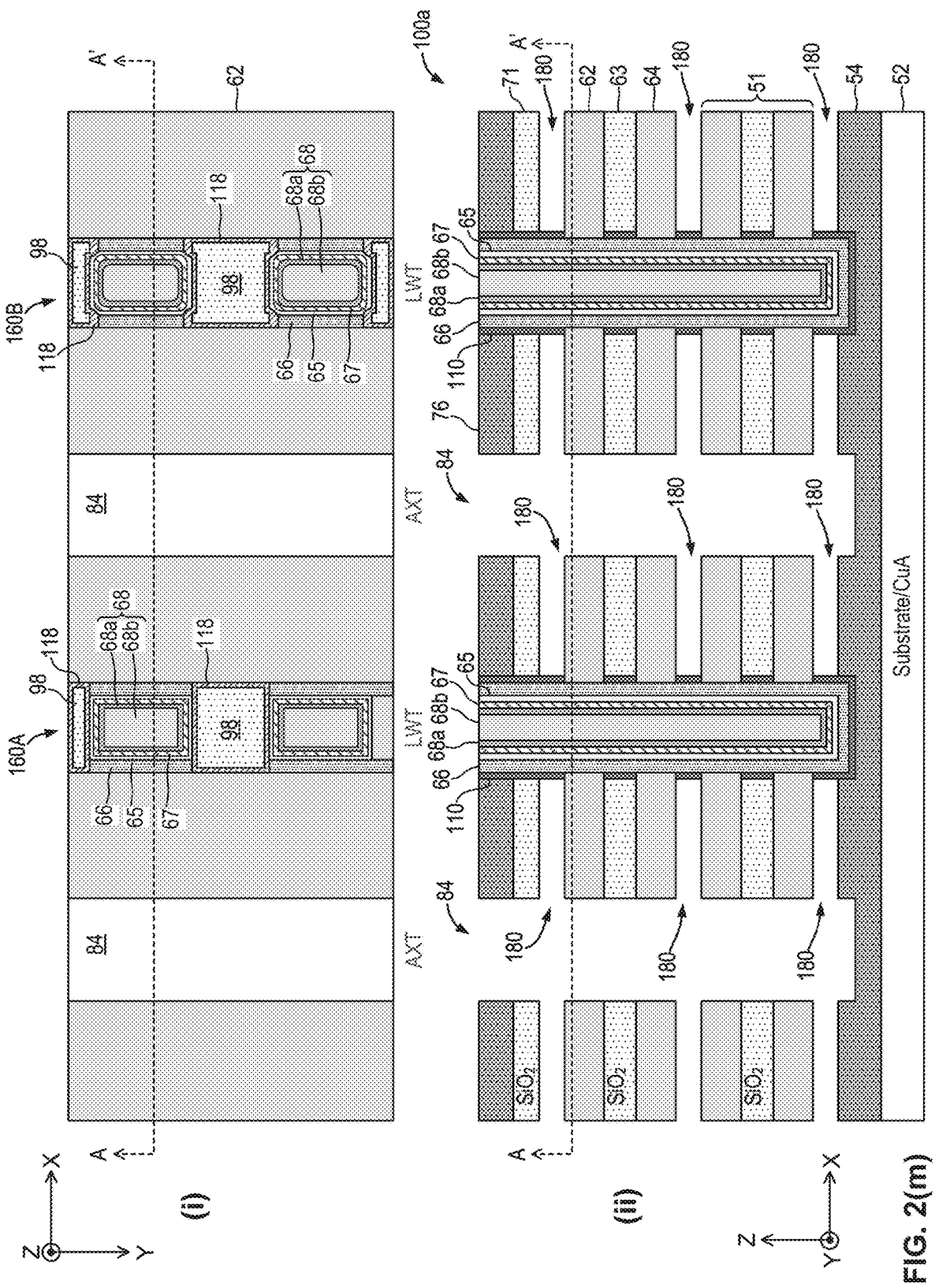
Figure 2N:
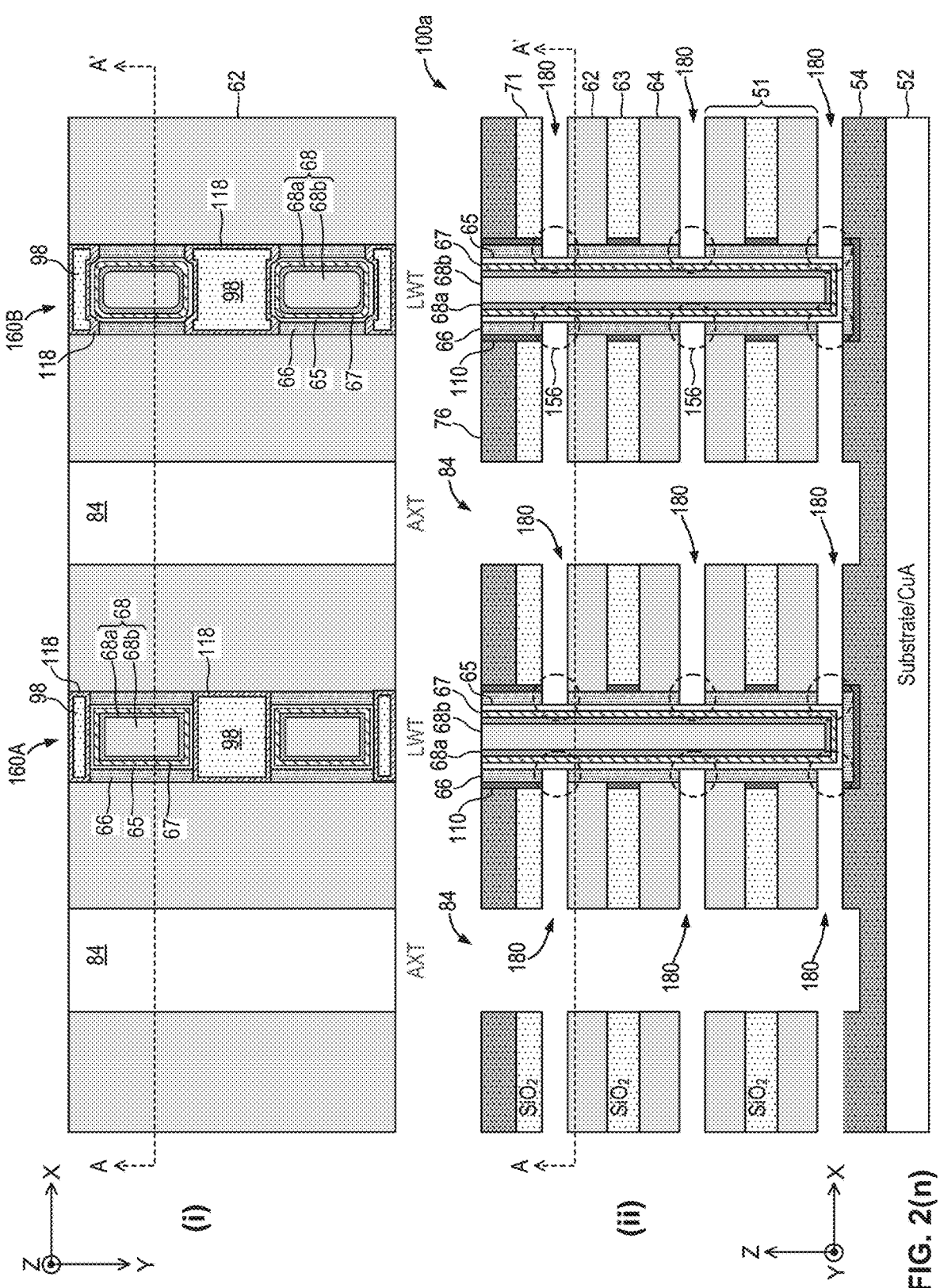
Figure 2O:
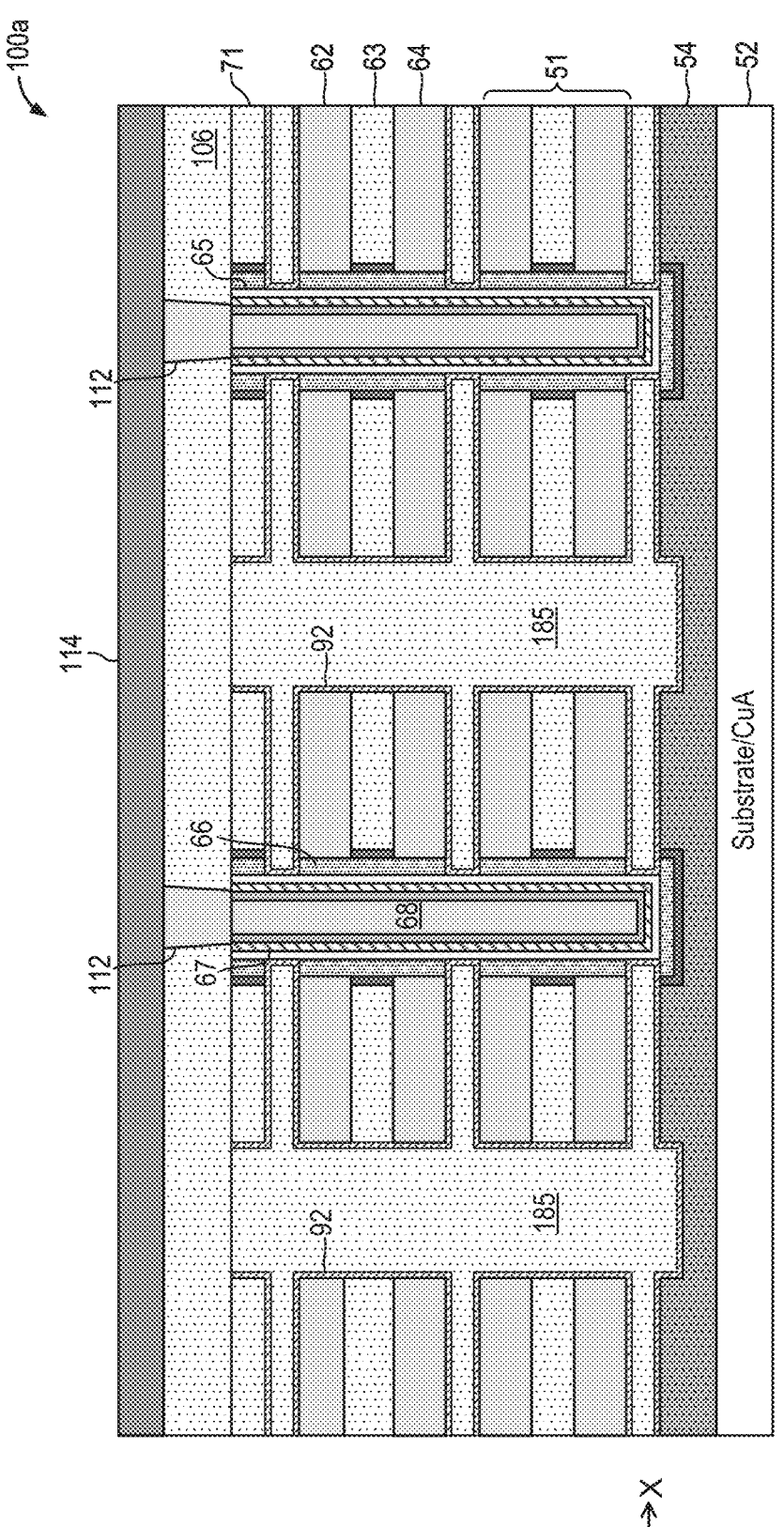
Figure 2P:
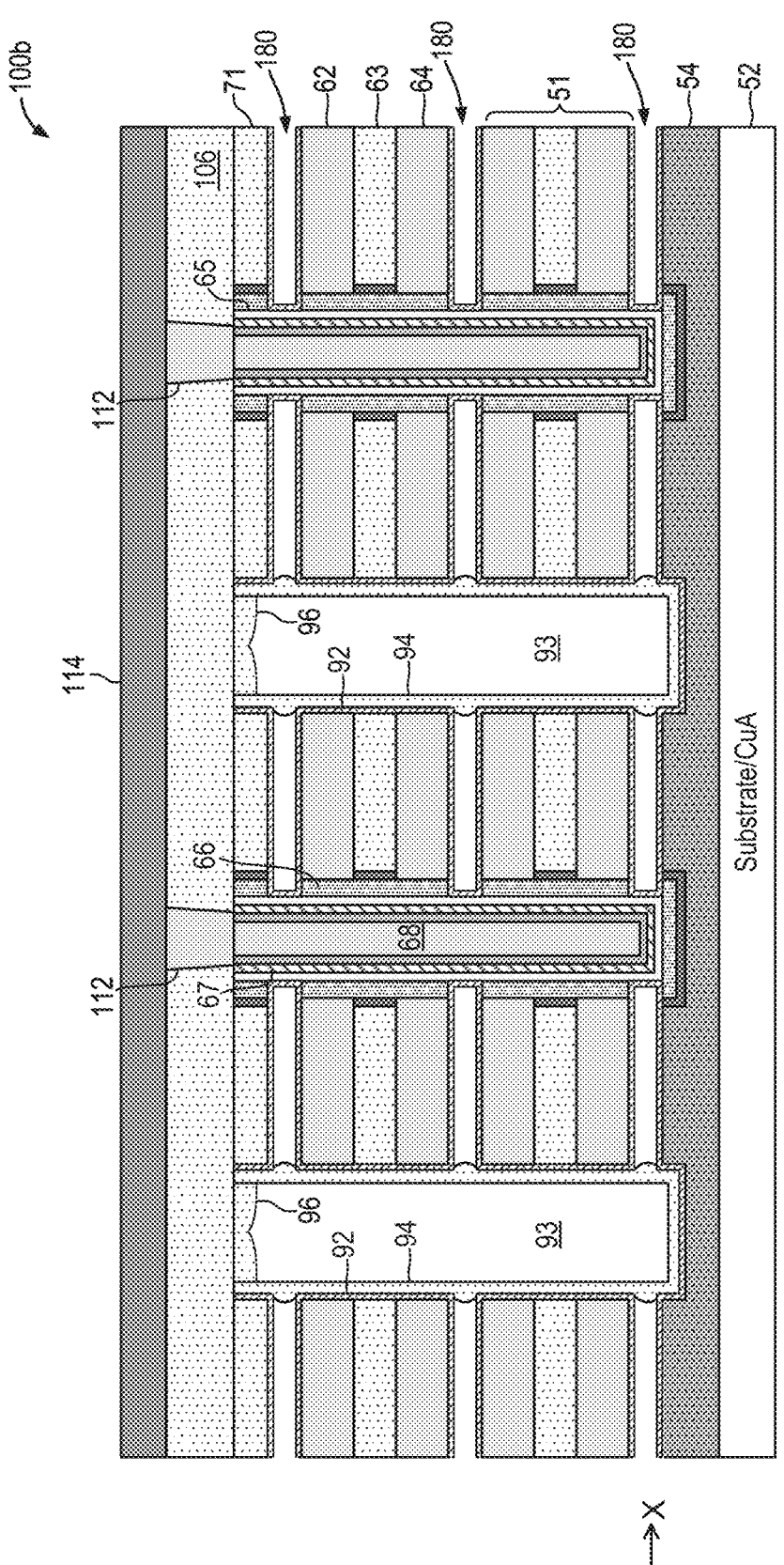

FIGS. 2(a) to 2(p), including FIGS. 2(i1) and 2(j1), illustrate a process for fabricating a memory structure including HNOR memory strings in embodiments of the present invention. Each figure in FIGS. 2(a) to 2(n) includes two views: view (i) is a horizontal cross-sectional view (i.e., in an X-Y plane) along line A-A' in view (ii), and view (ii) is a vertical cross-sectional view (i.e., in an X-Z plane) along line A-A' in view (i).

Referring to FIG. 2(a), initially, a semiconductor substrate 52 is provided and any circuitry to be formed in the substrate 52, such as the CuA and the interconnect conductors, are fabricated in or on the substrate 52. An insulating layer 54 is provided on top of the semiconductor substrate to cover and protect the circuitry formed on and in the semiconductor substrate 52. In some embodiments, the insulating layer 54 is a dielectric layer which may also serve as an etch stop layer for the subsequent processing steps. In some embodiments, the insulating layer 54 is a silicon oxycarbide (SiOC) layer or an aluminum oxide ($Al_2O_3$) layer. The insulating layer 54 can be formed using any material with suitable selectivity for the subsequent etch processes to be performed.

Subsequently, a memory structure 100 is formed by successive depositions of (i) a multilayer 51 and (ii) an inter-layer sacrificial layer 70 on the planar surface of the semiconductor substrate 52, or in particular on the insulating layer 54 formed on the substrate 52. In the present example, an inter-layer sacrificial layer 70 is deposited on the insulating layer 54 before the first multilayer 51 is deposited. The multilayer 51 includes three sublayers: (a) a first sacrificial layer 72, (b) a channel spacer dielectric layer 63, and (c) a second sacrificial layer 74, in this order in the Z-direction. FIG. 2(a) shows the memory structure 100 after the depositions of the initial layers of thin films. Multilayer 51 is also referred to in this detailed description as an "active layer." View (i) in FIG. 2(a) illustrates the horizontal cross-section along a line A-A' in the first sacrificial layer 72 in view (ii). View (ii) in FIG. 2(a) illustrates the vertical cross-section of the memory structure 100 along the line A-A' shown in view (i). The first and second sacrificial layers 72 and 74 are to be replaced by respective conductive layers in subsequent processing. The inter-layer sacrificial layer 70 (also referred herein as the third sacrificial layer) is to be replaced by an isolation material in subsequent processing to form an inter-layer isolation layer for providing separation between the active layers, as will be described in more details below. In one embodiment, each sublayer in the multilayer 51 and the inter-layer sacrificial layer 70 has a thickness of typically 30 nm or less. In another embodiment, the sublayers in the multilayer 51 and the inter-layer sacrificial layer 70 do not have the same thickness. In the present description, the dimensions are provided merely for illustrative purposes and are not intended to be limiting. In actual implementation, any suitable thicknesses or dimensions may be used.

In some embodiments, the lowermost and uppermost sublayers of memory structure 100 may optionally be designated as dummy sublayers that are not necessarily part of an active layer. Furthermore, in the present embodiment, the memory structure 100 includes a topmost inter-layer sacrificial layer 70 and a dummy dielectric layer 71 formed on the topmost inter-layer sacrificial layer 70. The topmost inter-layer sacrificial layer 70 will be subsequently replaced by the inter-layer isolation layer, such as an air gap isolation. The dummy dielectric layer 71 functions as a capping layer for the topmost inter-layer sacrificial layer 70 during the replacement process, as will be explained in more details below.

In some embodiments, the first and second sacrificial layers 72 and 74 are each a silicon nitride layer. The channel spacer dielectric layer 63 is an insulating dielectric material, such as silicon dioxide ($SiO_2$). The inter-layer (or third) sacrificial layer 70 is a sacrificial material selected from carbon, amorphous silicon (aSi), or silicon germanium (SiGe).

After the memory structure is formed with the desired number of multilayers 51 with the third sacrificial layers 70 therebetween and the optional dummy sublayers, a capping layer 76 is formed on the top of the memory structure. The capping layer 76 is used as a masking layer in subsequent processing, such as for use as a self align mask for forming the local word line structures. In some embodiments, the capping layer 76 is a silicon dioxide layer or a silicon oxycarbide (SiOC) layer. A mask 78 is applied on the memory structure (on the capping layer 76) to define trenches to be formed in the memory structure. In some embodiments, the mask 78 is an amorphous hard mask, such as an amorphous carbon hard mask. The mask 78 is patterned, for example, using a photo-lithographical patterning step, to define openings 79 where trenches are to be formed in the memory structure. It is instructive to note that the mask 78 is not drawn to scale in FIG. 2(a) and it is understood that an amorphous hard mask of sufficient thickness is provided in the high-aspect ratio etch process of the multilayer memory structure 100.

Referring to FIG. 2(b), using the patterned mask 78, a first set of trenches 80 are formed in memory structure 100 using, for example, a selective anisotropic etch process with the mask 78 as the masking layer. After the trench etch process, remaining portions of the mask 78 is removed and the resulting structure is shown in FIG. 2(b). The first set of trenches 80 are arranged in the X-direction across the memory structure 100. The anisotropic etch process etches or remove all layers in the areas exposed by the mask 78, stopping at the insulation layer 54, which functions as an etch stop. In the present description, the first set of trenches 80 is referred to as operational trenches or active trenches or local word line trenches (LWT), as the trenches will eventually accommodate the active ferroelectric storage transistors. In one example, each of the trenches 80 has a width of about 60 nm at the top of the trench and a pitch of 230 nm, with the trenches having a spacing of 170 nm apart. In other words, the operational trenches 80 are separated by a mesa of 170 nm. In subsequent processing, auxiliary trenches are to be formed in the mesa between each pair of operational trenches 80. The auxiliary trenches are to be formed equidistant between an adjacent pair of operational trenches 80. In one example, the auxiliary trenches may have a width of about 60 nm, resulting in a mesa between an operational trench and an auxiliary trench of about 55 nm, where the remaining mesa forms the active stack in the memory structure, as will be described in more details below. In other embodiments, the auxiliary trenches may have a width that is less than the width of the operational trenches.

Referring to FIG. 2(c), with the operational trenches 80 thus formed, a first dielectric liner layer 110 is deposited on the sidewalls of the trenches 80. For example, the first dielectric liner layer 110 is deposited conformally on the sidewalls of the trenches 80. In one embodiment, the first dielectric liner layer 110 is deposited by atomic layer deposition (ALD), chemical vapor deposition (CVD) or a combination thereof. In the present embodiment, the first dielectric liner layer 110 is a silicon dioxide layer (SiO$_2$). In other embodiments, the first dielectric liner layer 110 can be another dielectric material that has etch selectivity to the material used for the first and second sacrificial layers 72, 74 and to the channel layer to be formed. In one example, the first dielectric liner layer 110 has a thickness of 1-5 nm in the X-direction. For example, the first dielectric liner layer 110 may have a thickness of 2 nm in the X-direction in one embodiment.

Referring to FIG. 2(d), subsequent to the first dielectric liner layer 110 being formed, a channel layer 66 is deposited on the sidewalls of the trenches 80, more specifically, on the first dielectric liner layer 110 already deposited in the trenches 80. The first dielectric liner layer 110, as thus deposited, provides a uniform surface for the deposition of the channel layer 66 so that the channel layer can achieve a uniform deposited surface. Without the first dielectric liner layer 110, the channel layer 66 would have to be deposited onto the multi-layer structure of the memory structure 100. The trench sidewall of the multi-layer structure is often not even because of the etching of the different materials across the multi-layer structure. Furthermore, process non-uniformities inherent in the etching process for forming deep trenches can lead to unevenness or roughness of the trench sidewall. Accordingly, depositing the channel layer 66 directly on the trench sidewalls may result in a channel layer with an uneven deposited surface, which may have a negative impact on the electrical characteristics of the ferroelectric storage transistors to be formed. In embodiments of the present invention, the fabrication process uses the first dielectric liner layer 110 as a liner underlayer for the channel layer 66 and the quality of the deposited channel layer 66 can be greatly improved.

In some embodiments, the channel layer 66 is deposited conformally on the first dielectric liner layer 110 formed on the sidewalls of the trenches 80. In one embodiment, the channel layer 66 is deposited by atomic layer deposition (ALD), chemical vapor deposition (CVD) or a combination thereof. In the present embodiment, the channel layer 66 is an oxide semiconductor layer, such as indium gallium zinc oxide (IGZO), indium zinc oxide (IZO), indium tungsten oxide (IWO), or indium tin oxide (ITO). In other examples, the channel layer 66 can be formed using other oxide semiconductor material compatible with IGZO. Furthermore, in some embodiments, the channel layer 66 may have a thickness in the X-direction of 1.5 nm to 10 nm. In one example, the channel layer 66 has a thickness of 6 nm in the X-direction. A second dielectric liner layer 115 is deposited to cover the channel layer 66 (FIG. 2(d)) and the remaining volume in the trenches 80 is filled with a sacrificial material 82 (or "sacrificial filler material"), as shown in FIG. 2(e). In one embodiment, the second dielectric liner layer 115 is a silicon dioxide layer (SiO$_2$) and may have a thickness in the X-direction of 1-5 nm. In other embodiments, the second dielectric liner layer 115 may be a silicon nitride layer or an undoped amorphous silicon layer. In one embodiment, the sacrificial material 82 is silicon germanium or carbon (such as spin-on carbon or SoC). To best protect the channel layer 66, the second dielectric liner layer 115 is preferably deposited in the same deposition tool to avoid exposure of the channel layer to oxidation. After the deposition steps, excess material may be removed from the top of memory structure 100 using, for example, chemical-mechanical polishing (CMP). The resulting memory structure 100 is shown in FIG. 2(e). In embodiments of the present disclosure, the second dielectric liner layer 115 is optional and may be omitted in other embodiments. The second dielectric liner layer 115 is beneficial in some cases to protect the channel layer until the local word line structure is formed.

Thereafter, the memory structure 100 is patterned to form the local word line structures. In the present description, local word line structures refer to the columnar structures formed by the ferroelectric dielectric layer and the gate conductor layer. In the present description, the term "gate electrode structure" is used to refer to a local word line structure and the portions of the channel layer intersecting with the local word line structure. Referring to FIG. 2(f), a mask 194 is applied to the memory structure 100 with openings exposing areas for forming deep shafts which will be used to isolate the storage transistors to be formed along a memory string. In some embodiments, the mask 194 is a hard mask, such as an amorphous hard mask or an amorphous carbon hard mask. In the present embodiment, mask 194 is configured in a line and space pattern where the mask 194 includes lines covering areas to be protected and space or openings exposing areas to be etched to form shafts 95. The lines in the mask 194 can have a dimension d2 and a separation d1 in the Y-direction to define a pitch d3 of the global word line conductors to be formed above the memory array (not shown) for connecting to the local word line gate conductors yet to be formed. With the mask 194 defining the openings, the exposed sacrificial material 82 is removed, such as by a selective anisotropic etch process. The exposed second dielectric liner layer 115 is then removed, such as by a selective wet etch process. Lastly, the oxide semiconductor channel layer 66 in the area defined by the openings (or between the lines in mask 194) is removed, such as by selective anisotropic dry etch or by atomic layer etch (ALE), or by controlled selective wet etch process. For example, the channel layer 66 may be an IGZO layer and the etchant can be a diluted hydrochloric acid (HCl). As a result, shafts 95 are formed in the LWL trenches between areas where LWL structures are to be formed, as shown in FIG. 2(f). In particular, the openings in mask 194 overlap the mesas of the memory structure 100 and the etch process is defined by the mask 194 and self-aligned to the capping layer 76, forming shafts 95 in the area of the local word line trenches only. The first dielectric liner layer 110 remains in shafts 95 and will be used as an etch stop in subsequent processing, as will be explained in more detail below.

More specifically, in embodiments of the present invention, the etching of the channel layer 66 should be performed to limit any unintended sideway etch into the active stacks of active layers 51 at the face of the vertical sidewalls of the local word line trenches (LWT) that have become exposed to the etchant when the channel material 66 has been etched away. In alternate embodiments, the exposed channel material 66 may be only partially etched in a controlled etch to not etch all the way through the full thickness of the channel layer 66, leaving a much thinner remaining channel material along the exposed sidewalls in shafts 95 (not shown), thereby to substantially reduce its effectiveness as a parasitic channel conductor between adjacent LWL structures in the local word line trenches. By removing or disabling the channel material in shafts 95, physical and electrical separation of the storage transistors to be formed along each memory string in the Y-direction is realized.

However, under actual manufacturing process conditions, a limited amount of over-etch often occurs. FIG. 2(g) illustrates in view (i) the top view of a local word line trench 150A having an ideal etch profile and a local word line trench 150B having a typical actual etch profile. Ideally, the shafts 95 are formed without over-etching of the channel material 66 into the area covered by the mask 194, as shown by local word line trench 150A. However, in most cases, a small over-etch of the second dielectric liner layer 115 and the channel layer 66 results, as shown by the dotted circle 152 in the local word line trench 150B. In particular, the etching of the second dielectric liner layer 115 and the channel layer 66 is selective to the sacrificial material 82 so that the over-etching results in recessing of the channel layer 66 and the second dielectric liner layer from the side wall of the sacrificial material 82 facing the shafts 95.

Referring to FIG. 2(h), the shafts 95 are filled with a dielectric material, forming dielectric filled shafts 98. In some embodiments, the dielectric material is silicon dioxide (SiO₂) or other dielectric materials with similar dielectric constants, that is, a dielectric constant of around 3.9. The dielectric filled shafts 98 serve as dielectric separation between adjacent local word lines or gate conductors to be formed in the local word line trenches. Storage transistors are to be formed along each active stack bordering the local word line trenches (in the Y-direction), in the spaces between adjacent dielectric filled shafts 98.

To form the local word line structures, the sacrificial material 82 and the second dielectric liner layer 115 are removed by selective etch from the areas between the dielectric filled shafts 98, exposing the channel layer 66 which remains on the sidewalls of the mesas, as shown in FIG. 2(i). The removal of the second dielectric liner layer 115 and the sacrificial material 82 expose cavities 120 in the local word line trenches. In this case, the ideal local word line profile (LWT 150A) is that the dielectric filled shafts 98 is not etched in the process of forming cavities 120. Meanwhile, in actual processing, the removal of the second dielectric liner layer 115 and the sacrificial material 82 often removes some of the dielectric material from the dielectric filled trenches 98, as shown by the dotted circles 154 in the local word line trench 150B.

The fabrication process then proceeds to form the gate dielectric layer of the storage transistors. Referring to FIG. 2(j), a gate dielectric layer 67 is deposited onto the sidewalls of the excavated cavities in the local word line trenches (LWT), on top of the channel layer 66. For example, the gate dielectric layer 67 may be deposited using atomic layer deposition. Then, a gate conductor layer 68 is deposited into the remaining volume of the excavated cavities. After the deposition steps, excess material may be removed from the top of memory structure 100 using, for example, chemical-mechanical polishing (CMP). The resulting memory structure 100 is shown in FIG. 2(j). Between each pair of dielectric-filled trenches 98, the conductive layer 68 provides a vertical local word line (LWL) that serves as gate electrode for each of the storage transistors that are vertically aligned in the same active stack.

In some embodiments, an interfacial layer 65 may be provided between the oxide semiconductor channel layer 66 and the ferroelectric gate dielectric layer 67. In some embodiments, the interfacial layer 65 is formed using a material with a high dielectric constant (K) ("high-K" material). In some embodiments, the interfacial layer 65 may be a silicon nitride (Si₃N₄) layer, or a silicon oxynitride layer, or an aluminum oxide (Al₂O₃) layer and may have a thickness of 1-2 nm. Other materials for the interfacial layer 65 may be indium tungsten oxide. In some embodiments, the interfacial layer 65 may be deposited using an atomic layer deposition (ALD) technique and furthermore, in some embodiments, the interfacial layer 65 may be deposited in the same process chamber as the ferroelectric gate dielectric layer, without breaking vacuum between the deposition of the two layers. In one embodiment, the interfacial layer 65 is an aluminum oxide (Al₂O₃) layer and is annealed to yield an amorphous film with the desired characteristics. In some embodiments, the aluminum oxide (Al₂O₃) layer can be annealed in oxygen (O₂), ozone (O₃), nitrous oxide (N₂O), forming gas (H₂N₂), or argon (Ar). The interfacial layer 65 is optional and may be omitted in other embodiments of the present invention.

In the present embodiment, the memory structure 100 is used to form ferroelectric storage transistors and the gate dielectric layer 67 is a ferroelectric material forming a ferroelectric polarization layer. The ferroelectric polarization layer can be deposited using an atomic layer deposition (ALD) technique and may have a thickness between 2 nm to 8 nm. A thermal anneal is performed to form the ferroelectric phase in the as-deposited ferroelectric material. For example, for zirconium-doped hafnium oxide (HZO), the ferroelectric phase is the orthorhombic phase of the material. In most cases, the ferroelectric material is annealed in the presence of a capping layer, typically a conductive layer. In one embodiment, the ferroelectric polarization layer is formed of a doped hafnium oxide material, such as zirconium-doped hafnium oxide (HfZrO or "HZO"). In other embodiments, the hafnium oxide can be doped with silicon (Si), iridium (Ir) or lanthanum (La). In some embodiments, the ferroelectric polarization layer is a material selected from: zirconium-doped hafnium oxide (HZO), silicon-doped hafnium oxide (HSO), aluminum zirconium-doped hafnium oxide (HfZrAlO), aluminum-doped hafnium oxide (HfO₂:Al), lanthanum-doped hafnium oxide (HfO₂:La), hafnium zirconium oxynitride (HfZrON), hafnium zirconium aluminum oxide (HfZrAlO), and any hafnium oxide that includes zirconium impurities.

In the present embodiment, the gate conductor layer 68 is a metal layer and can include a thin conductive liner 68a and a conductive filler material 68b. The thin conductive liner 68a may be a titanium nitride (TiN) liner or a tungsten nitride (WN) liner. The conductive filler material 68b may be a metal, such as tungsten (W) layer or molybdenum (Mo), or heavily doped n-type or p-type polysilicon.

In the memory structure 100 in FIG. 2(j), the local word line structures preferably have a regular profile without irregular features, such as sharp edges or sharp corners. The local word line trench 150A illustrates the desired local word line structures. However, in actual manufacturing process, the resulting local word line structures may include irregular features due to etching of the surrounding materials, as illustrated by local word line trench 150B. In some examples, as shown by the typical etch profile of the local word line trench 150B, the ferroelectric gate dielectric layer 67 and the gate conductor layer 68 may have sharp corners at the regions interfacing the dielectric-filled trenches 98, indicated by the dotted circle 155. These irregular features are often not desirable as they may result in concentrated electric field, leading to premature damages to the gate dielectric or channel layers.

In alternate embodiments of the present disclosure, the memory structure is fabricated using a dielectric liner layer to reduce or eliminate irregular features that may be formed in the local word line structures due to fabrication process conditions. FIG. 2(g1) illustrates a memory structure 100a after the intermediate processing step shown in FIG. 2(f) where the shafts 95 are formed in the local word line trenches. Typical processing conditions may result in over-etching of the channel layer 66 and the second dielectric liner layer 115 such that recess areas are formed in the adjacent regions, as denoted by the dotted circle 152 in FIG. 2(g). Referring to FIG. 2(g1), after shafts 95 are formed, a dielectric liner 118 is deposited into each shaft 95 and is formed on the perimeter of the shaft. The dielectric liner 118 has the effect of filling in and smoothing out any over-etched areas around the perimeter of each shaft 95 so that the local word line structures subsequently formed are free of irregular features. In some embodiments, the dielectric liner 118 is a silicon nitride (Si$_3$N$_4$) layer. In other embodiments, other suitable dielectric materials having suitable etch selectivity to the sacrificial material 82 and to the dielectric material filling the dielectric filled shafts 98. The local word line trenches 160A (desired) and 160B (actual) illustrate the shafts 95 with the dielectric liner 118.

Referring to FIG. 2(h1), the dielectric-lined shafts 95 are filled with a dielectric material, forming dielectric filled shafts 98. In the present embodiment, each dielectric filled shaft 98 includes the dielectric material being encircled by the dielectric liner 118. In some examples, the dielectric material can be silicon dioxide (SiO$_2$) or other dielectric materials with similar dielectric constants. Thereafter, the local word line structures are formed by removing the second dielectric liner layer 115 and the sacrificial material 82 from the areas between the dielectric filled shafts 98, such as by a selective etch process. The removal of the second dielectric liner layer 115 and the sacrificial material 82 expose cavities 120 in the local word line trenches. The channel layer 66 is exposed and remains on the sidewalls of the mesas, as shown in FIG. 2(i1). During the removal process, the dielectric liner layer 118 prevents the dielectric material from being removed from the shafts 98, as shown by structures in the local word line trench 160B.

The fabrication process then proceeds to form the gate dielectric layer of the storage transistors. Referring to FIG. 2(j1), a gate dielectric layer 67 is deposited onto the sidewalls of the excavated cavities in the local word line trenches (LWT), on top of the channel layer 66. Then, a gate conductor layer 68 is deposited into the remaining volume of the excavated cavities. After the deposition steps, excess material may be removed from the top of memory structure 100a using, for example, chemical-mechanical polishing (CMP). The resulting memory structure 100a is shown in FIG. 2(j1). Between each pair of dielectric-filled trenches 98, the conductive layer 68 provides a vertical local word line (LWL) that serves as gate electrode for each of the storage transistors that are vertically aligned in the same active stack. As thus formed, the local word line structures in the local word line trenches 160B are free of irregular features or sharp corners which may compromise the integrity of the gate dielectric layer and channel layer in the storage transistor thus formed.

The following description of the fabrication process will refer to the memory structure 100a formed including the dielectric liner layer 118. The fabrication process has now formed the vertical local word lines in the LWL trenches. Masks used in the local word line process are removed. Referring to FIG. 2(k), a mask (not shown) is applied which covers the LWL trenches and protects the local word line structures formed therein while exposing openings where the auxiliary trenches are to be formed. In some embodiments, the mask is an amorphous hard mask, such as an amorphous carbon hard mask. With the mechanical support from the dielectric filled shafts 98 and the local word line structures therebetween, a second set of trenches 84 are formed using substantially the same technique as discussed in conjunction with FIGS. 2(a) and 2(b) above. For example, the memory structure is selectively anisotropically etched using a patterned hard mask layer defining the openings for the second set of trenches. The anisotropic etch process etches or removes all layers in the areas exposed by the patterned hard mask, stopping at the etch stop layer 54. After the trench etch process, remaining portions of the mask is removed and the resulting memory structure 100a is shown in FIG. 2(k). The second set of trenches 84 is referred to as the auxiliary trenches. In some examples, the auxiliary trenches 84 may be 60 nm or less wide. Each of the second set of trenches 84 is cut between an adjacent pair of the local word line trenches (LWT) and each of the second set of trenches 84 is cut substantially equidistant between an adjacent pair of the local word line trenches (trenches 80). As a result of trenches 80 and 84 being cut in the multilayer memory structure, memory stacks are formed by the mesas of the multilayer memory structure which are referred to as "active stacks" in the present description. In some examples, the active stacks are each approximately 55 nm wide, which is the width of the bit-lines. The narrow bit line strips resulting from the cutting of the active layers 51 are referred herein as "active strips."

In embodiments of the present invention, the fabrication process forms the local word line trenches (LWT) to house the local word line structures for forming storage transistors with the active stacks bordering the LWTs. Meanwhile, the fabrication process forms the auxiliary trenches to facilitate metal replacement and channel separation processes. The auxiliary trenches do not include local word line structures and do not form storage transistors with the bordering active stacks. With the auxiliary trenches 84 thus formed, the fabrication process performs metal replacement where the first and second sacrificial layers 72 and 74 are removed and replaced with the respective first and second conductive layers.

Referring to FIG. 2(1), the first and second sacrificial layers 72 and 74 are removed using, for example, a selective dry etch or a selective wet etch process, thereby creating cavities between the channel spacer dielectric layer 63 and the inter-layer sacrificial layer 70. The first dielectric liner layer 110 functions as an etch stop for the removal of the first and second sacrificial layers 72 and 74. In this manner, the removal of the first and second sacrificial layers 72 and 74 stops on the first dielectric liner layer 110 and the channel layer 66 is protected during the etch process. Thereafter, the first dielectric liner layer 110 is removed to expose the backside of the channel layer 66. In one example, the first and second sacrificial layers 72 and 74 are silicon nitride layers which are removed using a selective wet etch process using hot phosphoric acid. In one example, the first dielectric liner layer 110 is a silicon dioxide layer and may be removed using a wet etch process, such as using hydrofluoric acid (HF). In the present embodiment, the removal of the first dielectric liner layer 110 will result in some amount of etching of the channel spacer dielectric layer 63, as the first dielectric liner layer 110 is the same material as the channel spacer dielectric layer (i.e. silicon dioxide). Accordingly, the thickness of the channel spacer dielectric layer 63 is reduced in the Z-direction by the amount of the thickness of the first dielectric liner layer 110, plus any over-etching that may be used. In particular, the etch process for the removal of the first dielectric layer 110 may include an additional over-etch amount to ensure that all of the dielectric materials are removed and the backside of the channel layer 66 is exposed to contact the conductive layers to be subsequently deposited. In one example, the first dielectric liner layer 110 has a thickness of 2 nm and the etch process includes an over-etch amount of 1 nm, with the target of the etch process to remove 3 nm of the first dielectric liner layer. The channel spacer dielectric layer 63 is therefore also etched by 3 nm at each interface with the first and second sacrificial layers 72, 74. The channel spacer dielectric layer 63 is therefore thinned by 6 nm in this example. It is instructive to note that the thickness of the channel spacer dielectric layer 63 determines the channel length of the storage transistors to be formed. The desired channel length can be obtained by providing a channel spacer dielectric layer 63 having an initial thickness being the sum of the desired channel length plus any subsequent etching of the channel spacer dielectric layer 63.

The remaining layers 63 and 70 are typically 30 nm or less in thickness and 30 nm to 60 nm long; they are held in place by being attached to the first dielectric liner layer 110, the channel layer 66, the ferroelectric layer 67 and the conductive liner 68a. All of these layers are supported by the rigid metallic vertical local word line 68, which is repeated every local word line pitch (as shown in FIG. 2(1)(i)) along the entire length of each memory string. The feature of having strong mechanical support by metallic local word lines spanning the entire depth of very tall and narrow memory stacks results in physical stability of the stacks, thereby enabling scaling up the height of the memory stacks even in case of very high aspect ratio memory structures.

With the sacrificial layers 72 and 74 removed and the first dielectric liner layer 110 also removed, a conductive layer is deposited on the memory structure 100a. Prior to the deposition process, the exposed backside of the channel layer 66 can be cleaned of any surface oxidation without damaging the channel layer. In some embodiments, the conductive layer is deposited using chemical vapor deposition or atomic layer deposition. The conductive layer fills the cavities in the multilayer memory structure and is also formed on the sidewalls of the auxiliary trenches 84 and also on the top surfaces of the multilayer memory structure. The excess material formed on the sidewalls and on the top surface of the multilayer memory structure is removed by a dry selective etch, and in some cases, followed by a selective wet etch process to remove remaining metal residues or stringers. The resulting structure is shown in FIG. 2(1).

Referring to FIG. 2(1), as a result of the metal replacement process, a first conductive layer 62 and a second conductive layer 64 are formed. The first and second conductive layers are in contact with the channel layer 66 and are spaced apart by the channel spacer dielectric layer 63. In each active layer 51, the first conductive layer 62 forms the common drain (bit) line and the second conductive layer 64 forms the common source line of the NOR memory string to be formed. In some embodiments, the first and second conductive layers 62, 64 are each a metal layer and may be a titanium nitride (TiN) liner and a tungsten (W) layer, a tungsten nitride (WN) liner and a tungsten (W) layer, a molybdenum layer or a cobalt layer, or other conductive materials described above.

Another beneficial effect of using the liner underlayer 110 is that the first and second conductive layers 62, 64 are widened (in the X-direction) by the thickness of the liner underlayer, which reduces the resistance of the drain and source lines formed by the first and second conductive layers. Without the liner underlayer, the width of the first and second conductive layers 62, 64 would be the same as the width of the active stacks, defined by the distance between adjacent local word line trench and auxiliary trench. However, with the use of the liner underlayer, the width of the conductive layers (denoted as "d4" in FIG. 2(1)) becomes the sum of the width of the active stacks and the width of the liner underlayer 110 that was removed. For example, when the liner underlayer 110 is 2 nm wide, the conductive layers 62, 64 are widened by the 2 nm width of the liner underlayer. Widening of the conductive layers 62, 64 has the effect of reducing the resistance of the conductive lines forming the drain and source terminals of the storage transistors in the horizontal NOR memory string. Furthermore, due to the etching or thinning of the channel spacer dielectric layer 63 during the removal of the liner underlayer 110, the first and second conductive layers 62, 64 also have wider thickness (in the Z-direction) as compared to the thickness of the first and second sacrificial layers that were replaced. The thickness of each conductive layer (denoted as "d5" in FIG. 2(1)) becomes the sum of the thickness of the sacrificial layer and the amount of etching of the channel spacer dielectric layer 63. For instance, the amount of etching of the channel spacer dielectric layer 63 (in the Z-direction) is the thickness (in the X-direction) of the liner underlayer 110, plus any over-etching that may be applied. For example, when the liner underlayer 110 is 2 nm wide, the conductive layers 62, 64 may have a thickness increased by 2 nm due to the etching of the channel spacer dielectric layer, plus any over-etching amount (e.g. 1 nm) that may be applied. Increasing the thickness of the conductive layers 62, 64 has the effect of reducing the resistance of the conductive lines forming the drain and source terminals of the storage transistors in the horizontal NOR memory string.

Following the metal replacement process, the auxiliary trenches 84 will now be used for separating the channel layer 66 between each active layer 51, in a process referred to as channel separation. Referring to FIG. 2(m), using the auxiliary trenches 84 which exposes the inter-layer sacrificial layer 70 from the sides of the active stack, the fabrication process removes the third sacrificial layer 70, leaving cavities 180 in places where the third sacrificial layer 70 used to be. Various removal processes can be used depending on the material used for the third sacrificial layer 70. For example, in the case the sacrificial layer 70 is a carbon layer, the carbon layer can be removed by ashing in an oxygen ambient. In the case the sacrificial layer 70 is amorphous silicon or silicon germanium, a selective wet or dry etch process can be used. The resulting memory structure 100a is shown in FIG. 2(m).

As shown in FIG. 2(m), the cavities 180 thus formed expose the first dielectric liner layer 110 between the multilayers 51 in the active stacks. The first dielectric liner layer 110 is removed, such as by a wet etch process to expose portions of the channel layer 66. In particular, the backside of the channel layer 66 is now exposed through auxiliary trenches 84 and the cavities 180. The auxiliary trenches 84 and the cavities 180 are then used to remove the exposed portions of the channel layer 66 that straddle two adjacent multilayers 51 in the active stack (in the Z-direction). Referring to FIG. 2(n), the fabrication process uses the auxiliary trenches 84 and cavities 180 to deliver high etch selectivity etchant to the backside of the channel layer 66 to selectively etch the exposed portions of the channel layer 66, as indicated by the dotted circles 156 in FIG. 2(n). As a result, the channel layer 66 is separated in the Z-direction to each multilayer 51. In some embodiments, the channel layer 66 is an oxide semiconductor material, such as IGZO, and the fabrication process uses, for example, sulfuric acid, citric acid, acetic acid, hydrochloric acid, or ammonium hydroxide ($NH_4OH$) in a wet etch process to selectively etch the exposed portions of the channel layer 66. In some embodiments, the memory structure 100a includes the interfacial layer 65 and the backside etch of the channel layer 66 is selective to the interfacial layer 65 so that the interfacial layer acts as an etch stop for the backside etch process. That is, the exposed portion of the channel layer 66 is etched through the auxiliary trenches 84 and cavities 180 and the etch process will stop when the interfacial layer 65 is reached. In one embodiment, the interfacial layer 65 is an aluminum oxide ($Al_2O_3$) layer. In another embodiment, the backside etch process may be implemented as a multi-step etch process, including an atomic layer etch step used in the removal of the last 1-2 nm of the channel layer, in which the atomic layer etch step stops on the interfacial layer 65 or stop on the ferroelectric polarization layer 67.

In alternate embodiments, the exposed portions of the channel layer 66 between two adjacent multilayers 51 in the active stack (in the Z-direction) can be partially removed, leaving a thin portion that does not function effectively as a parasitic channel conductor.

In the embodiment shown in FIG. 2(n), the channel separation process stops when the exposed portions of the channel layer 66 are removed and the channel region is physically separated (wholly or partially) and isolated to each active layer 51 in each active stack. In some embodiments, the channel separation process can continue, by a change of etchant chemistry or process, to remove the now exposed portions of the ferroelectric polarization layer 67. The separation of the ferroelectric polarization layer 67 is optional and may be omitted in other embodiments of the present invention. In some cases, care can be taken to minimize excessive undercutting by sideway etching of the channel layer 66 or the ferroelectric dielectric layer 67.

Referring to FIG. 2(o), after the channel separation process, the exposed surfaces of the memory structure 100a may be passivated, such as by forming a thin liner layer 92. The liner layer 92 is a thin dielectric layer, such as around 1-2 nm thick. The liner layer 92 can be a silicon dioxide layer, a silicon nitride layer or an aluminum oxide layer and serves to passivate or seal the exposed surfaces in the cavities 180 and the auxiliary trenches 84. In the present description, the thin liner layer 92 is also referred to as an air gap liner layer. In some embodiments, the liner layer 92 is formed of the same material as the interfacial layer 65. In one embodiment, the interfacial layer 65 and the liner layer 92 are aluminum oxide layers.

Then, the remaining cavities in the memory structure 100a may be filled with a dielectric material 185, such as silicon dioxide ($SiO_2$). The dielectric layer 185 fills the cavities 180 between active layers and also fills the auxiliary trenches 84. A cap oxide layer 106 is then formed above the completed memory structure 100a. In some embodiments, the cap oxide layer 106 may be a silicon dioxide layer and may have a thickness of 100 nm to 200 nm. Vias and interconnects are formed in and above the cap oxide layer 106 to form interconnection between the storage transistors and the control circuitry, such as the CuA formed in the substrate 52. For example, the bit lines and local word lines of the memory stack are connected with control, select, and sense circuits that are formed in the CuA in the semiconductor substrate. In one example, global word lines, formed using copper metallization processes and materials, can be formed above the cap oxide layer to connect the local word lines to the respective word line drivers formed in the CuA in the substrate 52.

FIG. 2(o) illustrates the memory structure 100a including the global word line connection. In the present example, a global word line metallization layer 114 is formed on the cap oxide layer 106 and connected to local word lines 68 formed in the memory structure 110a through vias 112 formed in the cap oxide layer. In some embodiments, the global word line metallization layer 114 is one of copper, tungsten, molybdenum, cobalt, or other metals, or compounds thereof. Vias 112 is filled with a metal layer, such as copper or other suitable metals. As thus configured, each global word line 114 is connected to a group of local word lines 68 to provide the control signal to the gate electrodes of the storage transistors formed in multiple memory planes associated with the respective vertical local word lines. More specifically, the global word lines 114 runs in the X-direction, perpendicular to the common bit lines 62 which runs in the Y-direction. Each global word line connects to the local word lines arranged in a row across the X-direction, as shown in FIG. 2(o). Meanwhile, the bit lines from different memory planes of each active stack are connected to bit line selectors through a staircase structure. The bit line selectors connect the bit lines to their respective sense amplifiers and voltage drivers circuit formed in the CuA, typically formed under the staircase structure.

In memory structure 100a, during the channel separation process, the topmost inter-layer sacrificial layer 70 is removed to provide access openings to the backside of the channel layer 66 and the channel layer 66 adjacent the dummy dielectric layer 71 is separated and isolated from the memory strings formed below. In this manner, vias 112 can be formed to contact the local word lines (gate conductor layer 68) without concern for possible electrical shorts to the channel layer 66. Each global word line 114 connects to the local word lines through vias 112 to provide the control signal to the gate electrodes of the storage transistors formed in multiple memory planes associated with the respective vertical local word lines.

In an alternate embodiment, the remaining cavities in the memory structure 100a (FIG. 2(n)) are not filled. Instead, the auxiliary trenches 84 are used to provide air gap isolation in the memory structure 100a. Referring to FIG. 2(p), the memory structure 100b implements two levels of air gap isolation. First, a dielectric layer 94 is deposited nonconformally into auxiliary trenches 84 which covers the sidewalls of the trenches 84 (i.e. covering the liner layer 92 on the trench sidewalls) while capping the ends of the inter-layer cavities 180 facing the auxiliary trenches 84. The dielectric layer 94 serves as a capping layer to create inter-layer air gap isolation regions between adjacent active layers 51 in each memory stack in the Z-direction. In some embodiments, the dielectric layer 94 is a non-conformally deposited dielectric layer, such as a silicon dioxide ($SiO_2$) layer or a silicon nitride ($Si_3N_4$) layer. The dielectric layer 94 implements the first level of air gap isolation by providing isolation in the vertical direction between storage transistors formed in an active stack.

Next, a dielectric layer 96 is formed at the top portions of the auxiliary trenches 84, such as by non-conformal deposition of a dielectric layer. In some examples, a dielectric layer, such as a silicon dioxide ($SiO_2$) layer, is deposited at the top portions of the auxiliary trenches 84 around circumference of the trenches. The deposition process continues by growing the dielectric layer non-conformally until the dielectric layer merges in the middle of the trenches, thereby forming a capping layer capping the remaining cavities of trenches 84. The cap oxide layer 106 may be formed above the completed memory structure 100b. The dielectric layer 96 creates an air gap isolation 93 between adjacent active stacks bordering the auxiliary trenches 84. The dielectric layer 96 implements the second level of air-gap isolation by providing isolation between adjacent memory stacks and reducing the parasitic capacitance therebetween. In particular, the first level of air gap isolation has the effect of minimizing the parasitic capacitive coupling between the first conductive layer (the bit line) in one memory plane and the second conductive layer (the source line) in an adjacent memory plane. The second level of air gap isolation has the effect of minimizing the parasitic capacitance between adjacent active stacks. In some embodiments, the dielectric layer 96 and the dielectric layer 94 are formed of the same dielectric material. In other embodiments, the dielectric layer 96 and the dielectric layer 94 can be formed of different dielectric materials. The dielectric layer 96 and dielectric layer 94 together provide extra mechanical strength and stability to memory array 100b by preventing listing or collapsing of long strings of tall and narrow memory stacks.

In further embodiments, a memory structure can be constructed to include either one of the two levels of air gap isolation. That is, the memory structure can form the first level of air gap isolation using the dielectric capping layer 94 and the remaining cavities in the auxiliary trenches 84 are filled with a dielectric material, such as silicon dioxide ($SiO_2$). Alternately, the memory structure can fill the inter-layer cavities 180 with a dielectric material, such as silicon dioxide ($SiO_2$) and the remaining cavities is capped by the dielectric capping layer 96 to form the second level of air gap isolation, without the first level of air gap isolation. The materials or types of isolation used for the inter-layer cavities and the auxiliary trench cavities can be selected based on the amount of desired parasitic isolation between the storage transistors within each active stack and between the active stacks.

Figure 3:
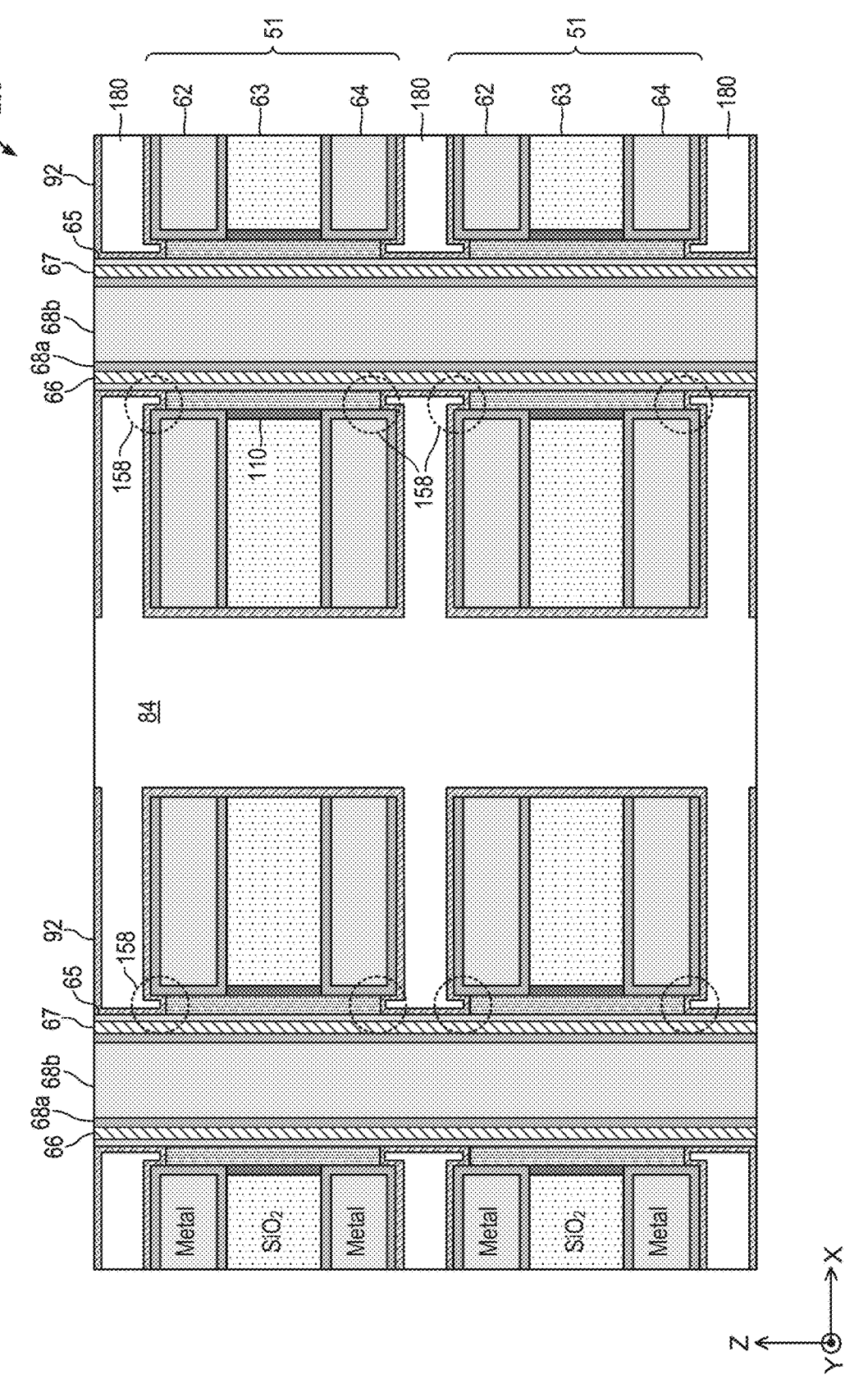
FIG. 3 is an expanded cross-sectional view of ferroelectric storage transistors formed in a portion of a memory structure in embodiments of the present invention.

FIG. 3 is an expanded cross-sectional view of ferroelectric storage transistors formed in a portion of a memory structure in embodiments of the present invention. Referring to FIG. 3, a memory structure 200 of ferroelectric storage transistors are formed in substantially the same manner as described above with reference to FIGS. 2(a) to 2(p). In particular, during the channel separation process (FIG. 2(n)), the auxiliary trenches 84 and the excavated cavities 180 created by removing the inter-layer sacrificial layer 70 is used to remove the channel materials between two adjacent active layers (in the Z-direction), as indicated by the dotted circles 156 in FIG. 2(n). The channel separation process uses high etch selectivity etchant to etch the exposed portions of the channel layer 66. For example, when the channel layer 66 is an oxide semiconductor material, such as IGZO and the channel separation process may use sulfuric acid, citric acid, acetic acid, or ammonium hydroxide ($NH_4OH$) in a wet etch process to selectively etch the exposed portions of the channel layer 66. In other examples, an atomic layer etch (ALE) process may also be used. In some examples, the interfacial layer 65, when present, can act as an etch stop for the channel separation process.

In embodiments of the present invention, the channel separation process is carried out to over-etch the channel layer within the cavities 180 to create recesses in the channel layer at each active layer, as indicated by the dotted circles 158 in FIG. 3. That is, the channel separation process is carried out such that the channel layer 66 is recessed from the edges of each active stack. In some examples, the channel layer can be recessed between 1 to 5 nm. It is instructive to note that undercutting of the channel layer is usually not observed in the conventional fabrication process because of the difficulty for the etchant to penetrate into the undercut areas. In embodiments of the present invention, the channel layer is purposely over-etched, using a wet etch process or an ALE process, to create the channel layer recess. Subsequently, the liner layer 92 is formed on the exposed surface of cavities after the channel separation process, including the recessed channel areas (dotted circle 158). In some embodiments, the remaining cavities are left unfilled to provide an airgap isolation in the memory structure. As thus configured, an air gap isolation is formed at the channel recessed area, which has the effect of providing effective isolation of the source and drain terminals of the storage transistors between adjacent active layers.

Furthermore, the etching or recessing of the channel layer 66 within an active layer can be used to tune the channel length of the storage transistors. That is, the channel layer 66 can be recessed to a desired amount to obtain a given channel length for the storage transistors. In this manner, the electrical characteristics of the ferroelectric storage transistors is tuned by virtual of etching and recessing the channel layer 66 to a desired amount during the channel separation process. In one embodiment, air gap isolation is used to provide isolation of the storage transistors in the vertical direction (Z-direction), including air gap isolation at the recessed channel areas. In alternate embodiments, the cavities 180 and the auxiliary trenches 84 can be filled with a dielectric material (e.g. silicon dioxide) formed on the liner layer 92.

In some embodiments, a fabrication process includes removing the exposed portions of the oxide semiconductor layer after removal of the inter-layer sacrificial layer and further removing, using the inter-layer excavated cavities, portions of the oxide semiconductor layer formed adjacent the conductive layers near the inter-layer excavated cavities to form recessed channel areas. In some embodiments the fabrication process further includes forming a liner layer on the exposed surface of the memory structure, including the inter-layer excavated cavities, the recessed channel areas and cavities exposed by the auxiliary trenches. In further embodiments, the fabrication process includes forming a dielectric capping layer in a top portion of the auxiliary trenches to cap the trenches. The dielectric capping layer forms an air gap cavity in the auxiliary trenches under the dielectric caping layer, in the inter-layer excavated cavities and in the recessed channel areas.

In the above-described embodiments, various memory structures including multiple active layers (or memory planes) have been described. Each memory structure includes multiple memory stacks, each memory stack including multiple active layers, to realize a three-dimensional array of NOR memory strings. The memory structures can be used as the basic building block to form a high capacity, high density memory device including multiple three-dimensional arrays of the NOR memory strings. For example, the three-dimensional arrays of NOR memory strings may be arranged as a two-dimensional array of tiles, each tile including a three-dimensional array of NOR memory strings constructed using one of the memory structure described above and including staircase portions and other supporting circuitry, including connecting wiring through global word lines at the top or bottom of each of the tiles.

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A process suitable for use in fabricating a memory structure comprising storage transistors configured in a NOR memory string above a planar surface of a semiconductor substrate, the process comprising:

above the planar surface, repeatedly depositing, alternately and one over another, a multilayer and an inter-layer sacrificial layer, each multilayer comprising first and second sacrificial layers and a first isolation layer between the first and second sacrificial layers;

forming a first plurality of trenches in the multilayers and the inter-layer sacrificial layers, each trench having (i) a depth that extends along a first direction that is substantially normal to the planar surface, (ii) a length that extends along a second direction that is substantially parallel to the planar surface, (iii) a width that extends along a third direction that is substantially orthogonal to the depth and the length, the length of the trench being substantially greater than the width;

forming a first liner layer on the sidewalls of the first plurality of trenches;

forming an oxide semiconductor layer on the first liner layer;

forming a second liner layer on the oxide semiconductor layer;

filling remaining volume of the first plurality of trenches with a sacrificial filler material;

forming dielectric filled shafts between the sacrificial filler material in the first plurality of trenches, each dielectric filled shaft including a dielectric material formed between the first liner layer disposed on opposite sidewalls of the respective trench;

forming gate electrode structures between the dielectric filled shafts in the first plurality of trenches, each gate electrode structure comprising: (i) a ferroelectric dielectric layer formed on the oxide semiconductor layer; and (ii) a gate conductor layer formed on the ferroelectric dielectric layer.

2. The process of claim 1, further comprising:

forming a second plurality of trenches in the multilayers and the inter-layer sacrificial layers, each trench in the second plurality of trenches having substantially the same depth and the same length as the first plurality of trenches, and wherein the first and second plurality of trenches divide the multilayers into a plurality of stacks of multilayer strips, each stack being separated from an adjacent stack by one of the trenches;

using access through the second plurality of trenches, removing the first and second sacrificial layers to form excavated cavities, the removing using the first liner layer as an etch stop layer;

using access through the second plurality of trenches and the excavated cavities, removing the first liner layer to expose the oxide semiconductor layer; and forming first and second conductive layers in the excavated cavities, including cavities formed from the removed first liner layer, the first and second conductive layers being in contact with the oxide semiconductor layer.

3. The process of claim 2, further comprising:

using access through the second plurality of trenches, removing the inter-layer sacrificial layer to form inter-layer excavated cavities;

using access through the second plurality of trenches and the inter-layer excavated cavities, removing the first liner layer, thereby exposing portions of the oxide semiconductor layer formed on the sidewalls of the first plurality of trenches; and using access through the second plurality of trenches and the inter-layer excavated cavities, removing the exposed portions of the oxide semiconductor layer.

4. The process of claim 3, further comprising:

forming a third liner layer on the exposed surface of the memory structure, including the inter-layer excavated cavities and cavities exposed by the second plurality of trenches.

5. The process of claim 2, wherein forming the first and second conductive layers comprises forming the first and second conductive layers having a width in the third direction being the sum of a width of the stacks of multilayer strips and a width of the first liner layer.

6. The process of claim 5, wherein the width of the first liner layer is between 1-5 nm.

7. The process of claim 5, wherein forming the first and second conductive layers further comprises forming the first and second conductive layers having a thickness in the first direction at least being the sum of a thickness of the first or second sacrificial layer and a thickness of the first liner layer.

8. The process of claim 1, wherein forming the first liner layer on the sidewalls of the first plurality of trenches comprises forming a first dielectric layer as the first liner layer on the sidewalls of the first plurality of trenches, the first dielectric layer having etch selectivity to the first and second sacrificial layers and the oxide semiconductor layer.

9. The process of claim 8, wherein the first liner layer comprises a silicon dioxide layer.

10. The process of claim 1, wherein forming the second liner layer on the oxide semiconductor layer comprises forming a second dielectric layer as the second liner layer on the oxide semiconductor layer.

11. The process of claim 10, wherein the second liner layer comprises a dielectric layer selected from a silicon dioxide layer, a silicon nitride layer, and an undoped amorphous silicon layer.

12. The process of claim 1, wherein forming dielectric filled shafts between the sacrificial filler material in the first plurality of trenches comprises:

defining a plurality of openings along the first plurality of trenches;

using the defined openings, removing the sacrificial filler material and the second liner layer to expose the oxide semiconductor layer;

subsequent to removing the second liner layer, removing the oxide semiconductor layer exposed in each of the first plurality of trenches; and filling the openings with a third dielectric layer to form the dielectric filled shafts.

13. The process of claim 12, further comprising:

subsequent to removing the oxide semiconductor layer in each trench, forming a fourth liner layer in the openings; and filling the openings with the third dielectric layer to form the dielectric filled shafts, the third dielectric layer being encircled by the fourth liner layer.

14. The process of claim 13, wherein forming the fourth liner layer comprises forming a fourth dielectric layer as the fourth liner layer, the fourth dielectric layer having etch selectivity to the sacrificial filler material and to the third dielectric layer.

15. The process of claim 14, wherein the third dielectric layer comprises a silicon dioxide layer, the sacrificial filler material comprises silicon germanium or spin-on carbon, and the fourth dielectric layer comprises a silicon nitride layer.

16. The process of claim 12, wherein forming gate electrode structures between the dielectric filled shafts in the first plurality of trenches comprises:

removing the sacrificial filler materials from each trench between the dielectric filled shafts;

removing the second liner layer from each trench between the dielectric filled shafts to form cavities between the dielectric filled shafts and to expose the oxide semiconductor layer;

depositing the ferroelectric dielectric layer in contact with the oxide semiconductor layer on the sidewalls of the first plurality of trenches; and forming the gate conductor layer in the cavities between adjacent dielectric filled shafts, the gate conductor layer being in contact with and surrounded by the ferroelectric dielectric layer in each gate electrode structure.

17. The process of claim 16, further comprising:

subsequent to removing the second liner layer from each trench and before depositing the ferroelectric dielectric layer, forming an interfacial layer on the oxide semiconductor layer.

18. The process of claim 17, wherein forming the interfacial layer comprises forming a silicon nitride layer or an aluminum oxide layer or a layer of high dielectric constant material as the interfacial layer.

19. The process of claim 3, further comprising:

subsequent to removing the exposed portions of the oxide semiconductor layer, removing the ferroelectric dielectric layer exposed by the removal of the portions of the oxide semiconductor layer.

20. The process of claim 1, wherein the gate conductor layer comprises a titanium nitride layer.

21. The process of claim 1, wherein the ferroelectric dielectric layer comprises a doped hafnium oxide layer.

22. The process of claim 21, wherein the ferroelectric dielectric layer has a thickness of 2-8 nm in the third direction.

23. The process of claim 1, wherein the oxide semiconductor layer comprises one of an indium gallium zinc oxide (IGZO) layer, an indium zinc oxide (IZO) layer, an indium tungsten oxide (IWO) layer, or an indium tin oxide (ITO) layer.

24. The process of claim 23, wherein the oxide semiconductor layer has a thickness of 1.5 to 10 nm in the third direction.

* * * * *